(12) United States Patent
Kim et al.

(10) Patent No.: US 11,630,007 B2
(45) Date of Patent: Apr. 18, 2023

(54) GRAPHENE/POLYMER HETEROSTRUCTURE-BASED FLEXIBLE AND BIOCOMPATIBLE PRESSURE/STRAIN SENSOR

(71) Applicant: CLEMSON UNIVERSITY, Clemson, SC (US)

(72) Inventors: Soaram Kim, Clemson, SC (US); Goutam Koley, Clemson, SC (US); Yongchang Dong, Clemson, SC (US); Apparao M. Rao, Clemson, SC (US)

(73) Assignee: Clemson University, Clemson, SC (US)

( * ) Notice: Subject to any disclaimer, the term of this patent is extended or adjusted under 35 U.S.C. 154(b) by 344 days.

(21) Appl. No.: 16/909,453

(22) Filed: Jun. 23, 2020

(65) Prior Publication Data
US 2020/0400514 A1 Dec. 24, 2020

Related U.S. Application Data

(60) Provisional application No. 62/865,433, filed on Jun. 24, 2019.

(51) Int. Cl.
*G01L 1/18* (2006.01)
*H01C 17/00* (2006.01)
*H01C 1/14* (2006.01)
*H01C 10/10* (2006.01)

(52) U.S. Cl.
CPC .............. *G01L 1/18* (2013.01); *H01C 1/14* (2013.01); *H01C 10/10* (2013.01); *H01C 17/00* (2013.01)

(58) Field of Classification Search
CPC .......... H01C 1/14; H01C 10/10; H01C 17/00; G01L 1/18
See application file for complete search history.

(56) References Cited

U.S. PATENT DOCUMENTS

| | | | | |
|---|---|---|---|---|
| 7,129,554 | B2 * | 10/2006 | Lieber | ..................... C30B 11/00 |
| | | | | 257/E29.081 |
| 8,552,299 | B2 * | 10/2013 | Rogers | ................ H01L 21/4867 |
| | | | | 174/254 |
| 10,079,313 | B2 * | 9/2018 | Lee | ........................ H01L 29/267 |
| 10,441,185 | B2 * | 10/2019 | Rogers | ................. A61B 5/4875 |
| 2013/0134440 | A1 * | 5/2013 | Wang | ................... H01L 41/1132 |
| | | | | 438/34 |

(Continued)

OTHER PUBLICATIONS

Adadi, et al. "Electrospun Fibrous PVDF-TrFe Scaffolds for Cardiac Tissue Engineering, Differentiation, and Maturation" *Adv. Mater. Techn.* 5:1900820 (2020) pp. 1-11.

(Continued)

*Primary Examiner* — Kyung S Lee
(74) *Attorney, Agent, or Firm* — Dority & Manning, P.A.

(57) ABSTRACT

Pressure/strain piezoresistive are described that include a poled piezoelectric polymer such as PVDF or P(VDF-TrFE) and graphene. The poled piezoelectric polymer and the graphene are electronically coupled to form a heterojunction and provide an ultra-high sensitivity pressure/strain sensor. The sensors can be carried on a flexible supporting substrate such as PDMS or PET to exhibit high flexibility. The materials of formation can be biocompatible and the sensors can be wearable or implantable.

19 Claims, 16 Drawing Sheets

(56) References Cited

U.S. PATENT DOCUMENTS

2017/0205221 A1\* 7/2017 Gong ............... C08K 3/042

OTHER PUBLICATIONS

Apelt, et al. "Heterogeneous freezing on pyroelectric poly(vinylidene fluoride-co-trifluoroethylene) thin films" *Surf. Interf. Anal.* 52 (2020) pp. 1150-1155.

ASTM. "ASTM E111-17: Standard Test Method for Young's Modulus, Tangent Modulus, and Chord Modulus" *ASTM Int'l.* (2017) pp. 1-7, (Abstract only).

Bae, et al. "Graphene-P(VDF-TrFE) multilayer film for flexible applications" *ACS Nano* 7 (2013) pp. 3130-3138.

Brassard, et al. "Impact of Diabetes, Chronic Heart Failure, Congenital Heart Disease and Chronic Obstructive Pulmonary Disease on Acute and Chronic Exercise Responses" *Can. J. Cardiol.* 25 (2007) pp. 89B-96B.

Caliò, et al. "Piezoelectric Energy Harvesting Solutions" *Sensors* 14 (2014) pp. 4755-4790.

Dong, et al. "Multifunctional Pacemaker Lead for Cardiac Energy Harvesting and Pressure Sensing" *Adv. Health, Mater.* 28:e2000053 (2020) pp. 1-12.

Ducrot, et al. "Optimization of PVDF-TrFE processing conditions for the fabrication of organic MEMS resonators" *Sci. Rep.* 6:19426 (2016) pp. 1-7.

Han, et al. "r-Shaped hybrid nanogenerator with enhanced piezoelectricity" *ACS Nano* 7 (2013) pp. 8554-8560.

Hu, et al. "Bio-inspired Flexible Lateral Line Sensor Based on P(VDF-TrFE)/BTO Nanofiber Mat for Hydrodynamic Perception" *Sensors* 19:5384 (2019) pp. 1-10.

Huang, et al. "Graphene-Based Sensors for Human Health Monitoring" *Front. Chem.* 7:399 (2019) pp. 1-26.

Jin, et al. "Ch. 6: Smart Materials for Wearable Healthcare Devices" *Wearable Technologies* Intech Open (2018) pp. 109-138.

Jung, et al. "Influences of post-heating treatment on crystalline phases of PVDF thin films prepared by atmospheric pressure plasma deposition" *Molec. Cryst. Liq. Cryst.* 678 (2019) pp. 9-19.

Kim, et al. "Piezoresistive graphene/P(VDF-TrFE) hetero structure based highly sensitive and flexible pressure sensor" *ACS Appl. Mater. Interf.* 11 (2019) pp. 16006-16017, S1-S15.

Kim, et al, "P(VDF-TrFE) film on PDMS substrate for energy harvesting application" *Appl. Sci.* 8:213 (2018) pp. 1-11.

Kim, et al. "Self-powered Flexible Strain Sensor with Graphene/P(VDF-TrFE) Heterojunction" *IEEE 76th Dev. Res. Conf.* (2018) pp. 1-2.

Kim, S. "Graphene/P(VDF-TrFE) Heterojunction Based Wearable Sensors with Integrated Piezoelectric Energy Harvester" *Clemson U.* (2018) pp. 1-125.

Meereboer, N.L. "Tuning the crystalline phases of poly(vinylidene fluoride) for capacitive energy storage applications" *U. Groningen* (2019) pp. 1-139.

Pi, et al. "Flexible piezoelectric nanogenerator made of poly(vinylidenefluoride-co-trifluorethylene) (PVDF-TrFE) thin film" *Nano Ener.* 7 (2014) pp. 33-41.

Piezotech®. "Piezoelectric and Ferroelectric Copolymers & Inks" *Piezotech®* (2020) pp. 1-3.

Ren, et al. "Remarkably enhanced polarizabilily and breakdown strength in PVDF-based interactive polymer blends for advanced energy storage applications" *Polymer* 168 (2019) pp. 246-254.

SBIR. "Evaluation of PVDF Film as a Pressure Sensor" *SBIR STTR* 11924 (1990) p. 1.

Scalar. "Wearable Technology Market Worth USD 71.23 Billion 2013-2021" *Scalar Mkt. Res.* (2016) pp. 1-4.

Simoes, et al. "Tailoring the structural properties of PVDF and P(VDF-TrFE) by using natural polymers as additives" *Polym. Eng. Sci.* 47 (2009) pp. 2150-2157.

Singh, et al. "Design and Optimization of Sensors and Antennas for Wearable Devices" *IGI Global* (2019) pp. 1-196.

Smith, et al. "Piezoresistive Properties of Suspended Graphene Membranes under Uniaxial and Biaxial Strain in Nanoelectromechanical Pressure Sensors" *ACS Nano* 10 (2016) pp. 9879-9886.

Velez, et al. (Eds.) "Wearable Technologies and Wireless Body Sensor Networks for Healthcare" *Institution of Engineering and Technology* (2019) pp. 1-571.

Wang, et al. "Transparent and ferroelectric poly(vinylidene fluoride) film achieved by simple ultrasonic spray coating method" *Mater. Lett.* 247 (2019) pp. 71-74.

Wang, et al. "A flexible triboelectric-piezoelectric hybrid nanogenerator based on P(VDF-TrFE) nanofibers and PDMS/MWCNT for wearable devices" *Sci. Rep.* 6:36409 (2016) pp. 1-10.

Wearable Tech. "IDTechEx argues wearable tech market to exceed $30bn in 2016 and $150bn by 2026" *Wearable Tech* (2016) pp. 1-2.

Wearable Tech. "North America and Europe expected to lead wearable tech market until 2021" *Wearable Tech* (2016) pp. 1-2.

Wu, et al. "Wearable technology applications in healthcare: A literature review" *Online J. Nurs. Info. (OJNI)* 23 (2019) pp. 1-17.

\* cited by examiner

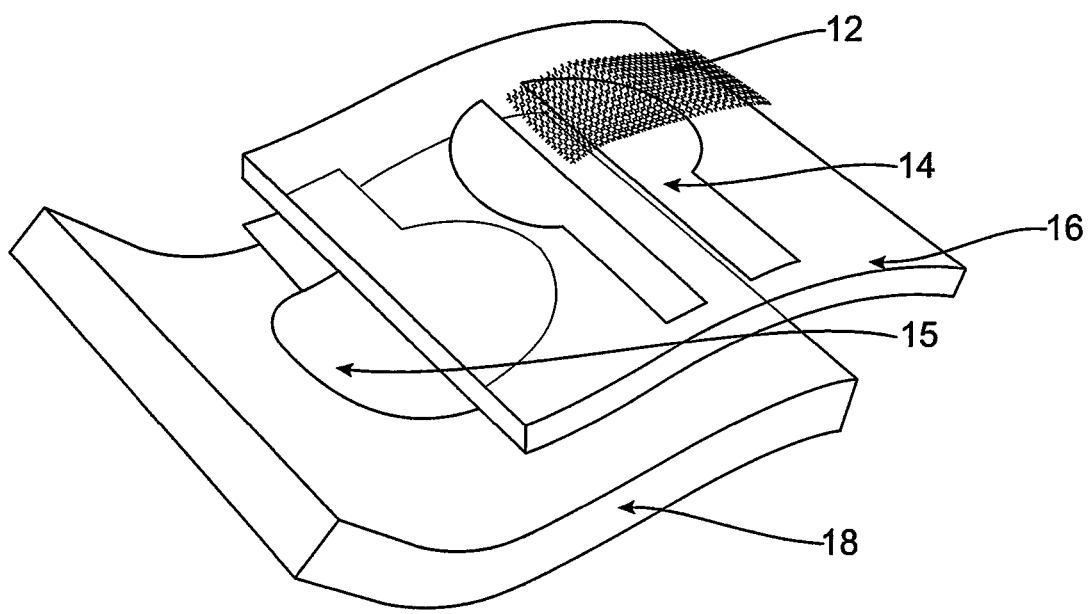
FIG. 6
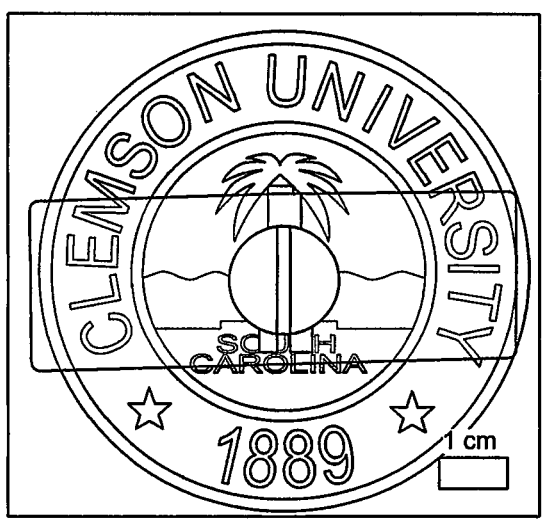 
FIG. 7A          FIG. 7B

GRAPHENE/POLYMER HETEROSTRUCTURE-BASED FLEXIBLE AND BIOCOMPATIBLE PRESSURE/STRAIN SENSOR

CROSS REFERENCE TO RELATED APPLICATION

This application claims filing benefit of Application Ser. No. 62/865,433, having a filing date of Jun. 24, 2019, which is incorporated herein by reference in their entirety.

FEDERAL RESEARCH STATEMENT

This invention was made with Government support under Grant Nos. IIP-1602006 and CBET-1606882, awarded by the National Science Foundation. The Government has certain rights in the invention.

BACKGROUND

Highly sensitive, flexible, and conformable strain/pressure sensors have attracted tremendous research interest in recent years due to their numerous applications in health care, gait analysis, and as smart monitoring systems, among others. Several material systems and device configurations have been investigated in development of these sensors including piezoelectric (e.g., ZnO thin films and nanowires, $BaTiO_3$ thin films and composites, polyvinylidene difluoride (PVDF), and polyvinylidene difluoride-co-trifluoroethylene (P(VDF-TrFE)), piezoresistive (e.g., thin Si, piezoresistive polymer, or carbon nanotube based), transistive (e.g., integrating a flexible transistor as a sensing element), and capacitive. Although many of these approaches are promising and have yielded high-sensitivity devices, the resulting devices have been found to be either not suitably flexible for many uses (and particularly anatomical uses) or to suffer from complex and expensive fabrication processes. Moreover, while piezoelectric polymers such as P(VDF-TrFE) have been used extensively in pressure, force, and strain sensors, the piezoelectric-based sensing approach severely limits one's ability to transduce dc or step changes in pressure or strain. Additionally, specially designed matching circuits are needed for piezoelectric polymer sensors in order to maximize response and sensitivity.

Graphene, with its outstanding material properties, has been considered for use in forming strain/pressure sensors. Graphene is a zero-overlap semi-metal with both holes and electrons as charge carriers and exhibits very high electrical conductivity that is potentially better than copper at room temperature. The electronic mobility of graphene is very high, with reported values greater than 15,000 square centimeters per Volt per second ($cm^2V^{-1}s^{-1}$). Graphene is atomically thin but possesses inordinate inherent strength, with an ultimate tensile strength of 130 gigapascals (GPa) and a surface density 0.77 milligrams per square meter ($mg/m^2$). Moreover, graphene also contains elastic properties, with an ability to retain its initial size after strain and to tolerate mechanical strain up to 20% before breaking. Unfortunately, development of a strain sensor utilizing graphene has not progressed as initially hoped.

What are needed in the art are strain sensors that can exhibit high sensitivity and good mechanical characteristics (e.g., strength, flexibility, low profile), while also being capable of being formed according to economical formation processes. Moreover, sensors that possess both piezoelectric and piezoresistive characteristics that can be self-powered and utilized in both static and dynamic sensing applications would be of great benefit.

SUMMARY

According to one embodiment, disclosed is a piezoresistive strain sensor that includes a first layer comprising a poled piezoelectric polymer and a second layer comprising graphene. The first and second layers are in electrical communication with one another such that the piezoelectric polymer and the graphene form a heterojunction. The sensors can be flexible and exhibit piezoresistive characteristics, and as such, can be self-powered and suitable for use in a wide variety of both dynamic and static applications.

Also disclosed is a method for forming a sensor that includes locating a first layer that includes a piezoelectric polymer in electrical communication with a second layer that includes graphene, such that the piezoelectric polymer is in electrical communication with the graphene and the piezoelectric polymer and the graphene form a heterojunction. The formation method can also include poling the piezoelectric polymer. A method can also include locating electrodes on either side of the first layer and locating a substrate, e.g., a flexible polymeric substrate, adjacent one or both sides of the other layers, for instance adjacent one of the electrodes. The substrate can provide strength and support to the remaining layers of the sensor, as well as insulate the sensor from surrounding materials. During use, the first and second electrodes can be placed in electrical communication with a circuit and a change in the resistance of the sensor as a function of force/strain can be measured, which can then be utilized to determine a force/strain on the sensor. In some embodiments, the force/strain placed on a sensor can also be used to generate an electric potential, which can be utilized in energy harvesting and/or to power the sensor. For example, wind energy can be harvested to realize a self-powered sensor for applications in, e.g., unattended, remote sensor nodes.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which:

FIG. 6 is an exploded view of a sensor described further herein.

FIG. 7A is a photographic image of a sensor laid flat.

FIG. 7B is a photographic image of a sensor folded.

Figure 1:
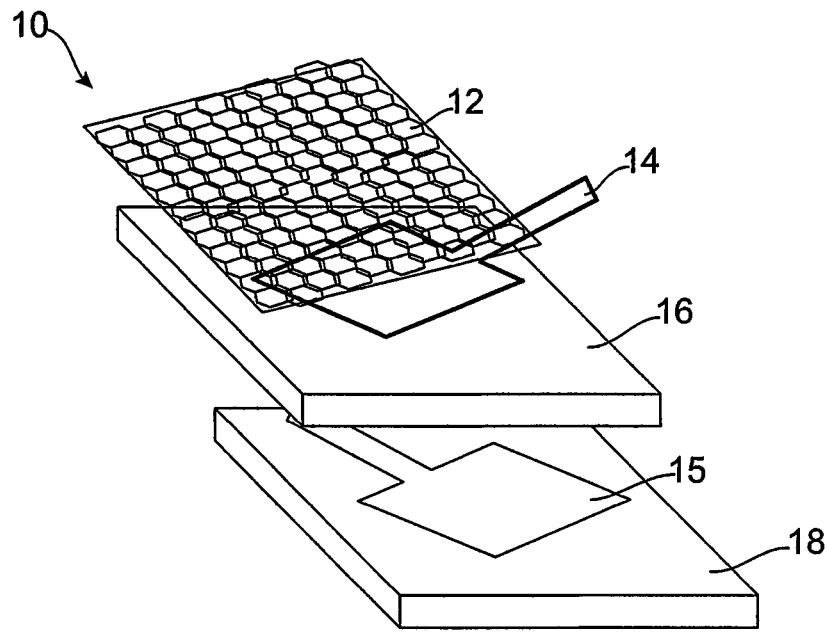
FIG. 1 is a schematic illustration of one embodiment of a sensor as described herein.

Repeat use of reference characters in the present specification and drawings is intended to represent the same or analogous features or elements of the present invention.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment may be used in another embodiment to yield a still further embodiment.

Disclosed are highly sensitive pressure/strain sensors that can be formed according to facile and low-cost fabrication techniques. In addition to exhibiting high sensitivity, disclosed sensors can also be flexible and, in some embodiments, biocompatible. As such, the sensors can be conformed to fit a surface of interest and can be useful in a large variety of applications. The sensors combine the advantages of a piezoelectric polymer with the high responsivity of graphene. The piezoelectric polymer and the graphene are electronically coupled to form a heterojunction and provide an ultrahigh sensitivity pressure/strain sensor. Beneficially, the sensors can be highly flexible and also durable. Moreover, the sensor can be formed of biocompatible materials and as such can be utilized in physiological applications, including as a self-powered implantable strain sensor.

Disclosed sensors can have highly desirable electrical and physical characteristics. For instance, the response of the sensors can be substantially linear with various pressure ranges (e.g., up to about 100 kPa). In addition, the sensors can be highly sensitive, e.g., a sensor can exhibit an average sensitivity of about 0.5 kilopascals$^{-1}$ (kPa$^{-1}$) or higher; for instance, about 0.6 kPa$^{-1}$ or higher, about 0.76 kPa$^{-1}$ or higher, or from about 0.5 kPa$^{-1}$ to about 1 kPa$^{-1}$ in some embodiments. The sensors are also viable through a large pressure/force range, e.g., from 0 to about 100 kPa, or even higher in some embodiments, and can have a low response time (e.g., about 100 microseconds (ms) or less). The sensors can also demonstrate a high signal to noise ratio, for instance about 20 decibels (dB) or higher, e.g., from about 25 dB to about 70 dB, or even higher in some embodiments. The sensors can also demonstrate a high gauge factor; for instance, about 5 or more, about 100 or more, or about 500 or more in some embodiments, e.g., from about 10 to about 450, in the range of pressure of from 0 to about 100 kPa. Moreover, variation in sensor design (e.g., layer number, individual layer materials, sizes, etc.) can be used to modify the sensors for particular applications. For instance, the sensors can be formed to exhibit a high sensitivity in a particular force/pressure range of interest through variation in number of individual layers, physical characteristics of the layers (e.g., thickness), particular materials of formation, etc.

A schematic showing an exploded view of one embodiment of a sensor 10 is provided in FIG. 1 and FIG. 6. As shown, a sensor 10 can include several layers including a graphene layer 12, first and second electrodes 14, 15, a piezoelectric polymer layer 16, and a supporting substrate layer 18.

The graphene layer 12 can include a single layer of graphene (i.e., a single atomic sheet of graphite) or can include several single layers that are weakly bonded to one another. For instance, the graphene layer 12 can include 1 to about 10, or 1 to about 6 individual graphene sheets in a single graphene layer 12. In one embodiment, the graphene of the graphene layer 12 can include a p-type doped graphene (i.e., it is p-type relative to pristine graphene) that remains p-type in the range of operation of the sensor and away from the Dirac point. Because pressure-induced strain can reduce the p-type concentration of graphene, the maximum operational range of a sensor can in one embodiment be limited by the degree of p-type doping in the graphene. As such, the graphene layer can be treated to increase the p-type doping concentration in some embodiments, which can enhance the dynamic range of a sensor.

It should be noted that the graphene can also include n-type graphene. In this embodiment, n-type graphene of a sensor can generally remain n-type over the entire operational range of the material so as to obtain a desired systematic response to pressure or strain.

The graphene of the layer 12 can generally be formed according to any suitable formation techniques as are known in the art, such as, and without limitation to, various chemical vapor deposition (CVD) methods. In one embodiment, the graphene layer 12 can include graphene synthesized on copper foil according to known CVD processing techniques. This formation approach can be useful in some embodiments as graphene synthesized on copper foil can be easily transferred to many different substrates without damage and thus preserving its quality. For example, a graphene layer can be synthesized on copper foil and processed to tune the intrinsic properties of the graphene and then transferred to the sensor element while maintaining both the desirable characteristics of the graphene as formed and the overall characteristics of the sensor (e.g., flexibility).

Beneficially, the field of graphene synthesis and transfer is well established, which can contribute to low costs in sensor formation. In addition, large area synthesis and transfer processes for graphene can be utilized in sensor formation and this can provide a facile route for patterning a sensing device into an array over dimensions reaching several feet.

P-type or n-type graphene can be prepared according to any known approach. For example, substitution of boron into the graphene backbone will tend to form a p-type graphene, as will adsorption (or intercalation in graphene oligolayers) of bromine, iodine, aromatic structures including electron-withdrawing groups, or diazonium salts (e.g., 4-bromobenzene diazonium tetrafluorate), or deposition of gold, bismuth, or antimony (in some embodiments, followed by annealing). P-type graphene may also be produced by annealing of the as-formed graphene and exposure to hydrogen plasma. N-type graphene can be formed by use of organic dopants or certain inorganic dopants (e.g., lanthanide complexes), as are known in the art.

Referring again to FIG. 1, the sensor 10 includes a layer 16 that incorporates a piezoelectric polymer. The atomically thin nature of graphene imparts the ability to "surface dope" the graphene. Through combination with the piezoelectric polymer, the carrier density of the graphene can thus be strongly affected due to electrostatic interaction with the fixed charge that can develop on the surface of the piezoelectric polymer layer under strain. Taking advantage of the high carrier mobility in graphene, such a charge change can result in a very high change in the resistance and result in correspondingly high sensitivity to pressure and strain. Thus, a strain on the composite sensor can induce a large carrier density variation in the graphene that is not possible in a sensor that utilizes graphene as the sole sensing element.

The piezoelectric polymer of the layer 16 can include any suitable piezoelectric polymer. In general, a piezoelectric polymer for incorporation in a sensor can exhibit a longitudinal piezoelectric effect in the direction of the Z-axis (axes according to the IRE-convention, i.e., Z-axis normal to the surface of the polymer layer 16) and transversal piezoelectric effects in the directions of the X- and/or Y-axis, respectively (along the surface of the polymer layer 16).

Exemplary piezoelectric polymers as may be incorporated in a layer can include, without limitation, PVDF, Polyacrylonitrile (PAN), fluorinated Ethylene-Propylene (FEP), as well as combinations and copolymers of any piezoelectric polymer. In one embodiment, the layer 16 can include PVDF or a copolymer of PVDF. In one particular embodiment, layer 16 can include a P(VDF-TrFE) copolymer. A copolymer can include the various components in any suitable proportion, e.g., from a molar ratio of from about 1:99 to about 99:1, when considering a two-component copolymer. For instance, a P(VDF-TrFE) can include the components in a molar ratio of vinylidene difluoride to trifluoro-ethylene of from about 10:90 to about 90:10, from about 20:80 to about 80:20, or about 50:50. In some embodiments, a P(VDF-TrFE) copolymer can include a lower mole ratio of the trifluoro-ethylene component as compared to the vinylidene difluoride component; for instance, a molar ratio of vinylidene difluoride to trifluoro-ethylene of from about 80:20 or about 75:25, in some embodiments.

While the layer 16 can be formed solely of the piezoelectric polymer, the layer 16 can optionally include additives that will not detrimentally affect the function of the sensor 10 including, for example, colorants, dyes, stabilizers, nucleating agents, and the like, as are generally known in the art. Additives can also include active agents that can affect the piezoelectric characteristics of the polymer. By way of example, a composition that forms the layer 16 can include inorganic additives, such as zinc oxide (ZnO), lead zirconate titanate (PZT), barium titanate, graphene nanoparticles, or gold nanoparticles, or any combination thereof, which can alter/improve the characteristics of the layer 16.

During fabrication of a sensor 10, the piezoelectric polymer can be poled to align the dipoles of the layer 16 to an external electric field. For instance, the piezoelectric polymer layer can be poled by subjecting the device to an electric field of from about 50 MV/m to about 150 MV/m across the polymer layer, e.g., about 100 MV/m for a period of time (e.g., from about 15 minutes to about 120 minutes, e.g., about 1 hour). The preferred magnitude of voltage applied the layer can depend on the thickness of the layer. For example, in order to apply 100 MV/m across a 1 μm thick layer, a voltage of 100 V can be applied. In the case of a 10 μm thick layer, the applied voltage would be 1000 V to obtain an applied voltage across the layer of 100 MV/m.

Figures 2A, 2B:
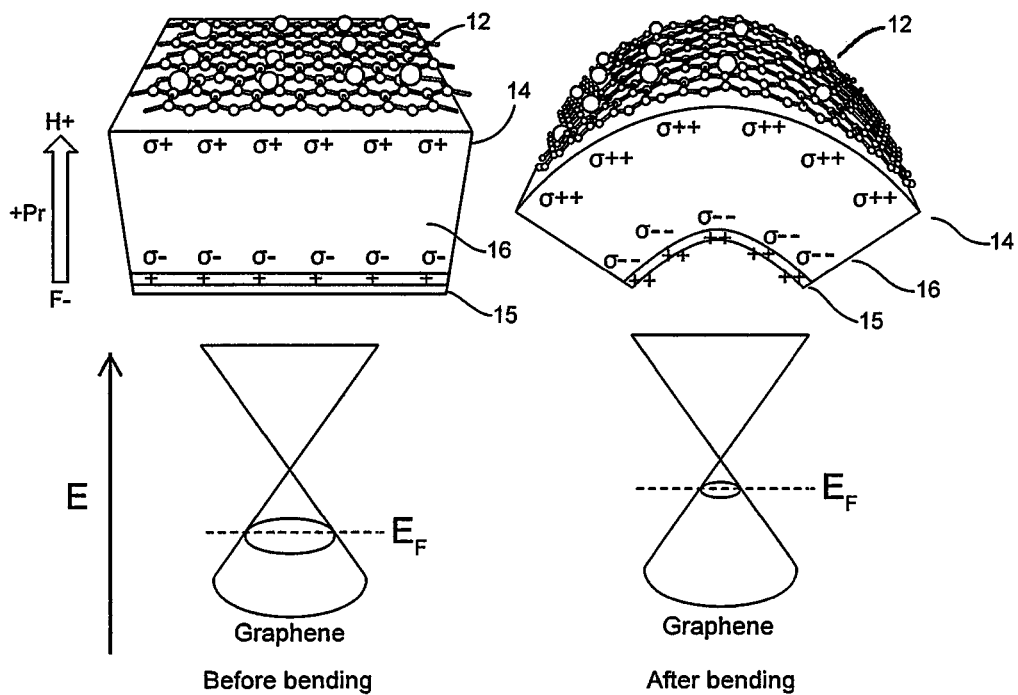
FIG. 2A illustrates application of a poling voltage relative to a graphene layer of a piezoelectric polymer layer (top) and also illustrates the Fermi level position (bottom) in the graphene in the absence of strain in the sensor.
FIG. 2B illustrates the charge distribution (top) and the Fermi level position (bottom) of the sensor of FIG. 2A when the sensor is under strain.

As schematically illustrated in the left panels of FIG. 2, poling of the piezoelectric polymer layer 16 will cause bonds (e.g., C—H and C—F bonds in a graphene/P(VDF-TrFE) composite) to orient the positive and negative charges along the direction of the applied poling field. These aligned dipoles can generate fixed surface charge when the film is subjected to external strain, as shown on the right, the magnitude of which then affecting the sensitivity of the overall device 10.

Without wishing to be bound to any particular theory, the mechanism of the sensor is believed to be attributed to a piezoresistive property of the graphene/piezoelectric polymer heterojunction converted from the piezoelectric property of the polymer film. This results in a variation in resistance in the graphene that in turn enables a step response in the sensor. When the sensor is under strain, as schematically illustrated in FIG. 2 on the right, increased tensile strain at the top surface of the polymer layer 16 enhances the positive fixed-charge density and attracts more negative charges (electrons) in the graphene. As illustrated in FIG. 2 on the right, as the sensor (see, e.g., FIG. 6) is subjected to strain a differential positive surface charge +Δσ is generated on the surface of the piezoelectric polymer layer 16 on which graphene is deposited (the upper layer in FIG. 2). This positive charge repels holes in the graphene of the layer 12, reducing its p-type nature by an amount of −Δσ. On the other hand, the opposite side of the piezoelectric polymer layer 16 undergoes a compressive strain, forming a differential negative surface charge −Δσ, which induces a positive charge +Δσ on the electrode 15 adjacent to that surface. Although ideally one can expect the fixed charge density to be completely compensated by the charge density changes in the graphene layer 12 and the electrode 15 contact, a relatively small part of the charge can still be compensated (forming charge dipole) across the piezoelectric polymer layer 16, giving rise to voltage spikes.

The voltage spikes are understood to be caused by partially uncompensated charges in the piezoelectric polymer layer 16 (part of this is compensated by graphene induced charges), which are compensated by opposite type charge at the bottom surface of the piezoelectric polymer layer 16 (FIG. 2). As the hole density is reduced, the Fermi level ($E_F$) of graphene moves upward compared to the unstrained graphene, as shown in the lower panels of FIG. 2. Additionally, the fixed charge developed on the surface of the piezoelectric polymer layer 16 is also expected to reduce the carrier mobility in the graphene 12 by increasing charged impurity scattering. The reductions in hole density and carrier mobility results in a strong increase in resistance. Moreover, the increased resistance can be maintained in the strained graphene layer 12 through electrostatic equilibrium between charge dipoles (i.e., between the top surface of the piezoelectric polymer layer 16 and the graphene layer 12 and between the bottom surface of the piezoelectric polymer layer 16 and electrode 15) and return back to its original value when the structure 10 is relaxed.

The piezoelectric polymer layer 16 can generally be fairly thin, e.g., about 2 micrometers (μm) or less, to impart desired sensitivity to the system. For instance, the piezoelectric polymer layer 16 can be from about 0.05 μm (50 nm) to about 10 μm, for instance from about 0.1 μm (100 nm) to about 5 μm. In some embodiments, the layer 16 can be about 1 μm or greater or about 2 μm or greater, with a minimum layer thickness dependent only on the ability to successfully pole the polymer layer. For instance, the piezoelectric polymer layer can be from about 1 μm to about 10 μm in some embodiments, e.g., from about 2 μm to about 10 μm or from about 1 μm to about 5 μm in some embodiments. However, it should be understood that the sensors are not limited to very thin polymer layers and in other embodiments, the piezoelectric polymer layer can be thicker, e.g., about 10 μm or greater; for instance, as may be formed by melt extrusion methods.

The piezoelectric polymer layer can be formed according to any suitable process including, without limitation, solution casting, spin coating, dip-coating, spray-coating, melt extrusion, and the like, generally followed by crosslinking of the polymer, depending upon the particular polymer used to form the layer 16.

A sensor can optionally include multiple graphene layers and/or multiple piezoelectric polymer layers. For example, in one embodiment, a sensor can include a graphene layer sandwiched between two piezoelectric polymer layers or a polymer layer between two graphene layers. Multiple composite structures can also be combined in a single sensor, for instance in a stacked arrangement or lateral to one another on a supporting substrate. In addition, a plurality of individual devices can be in electrical contact with one another or electrically isolated, depending upon the characteristics of the designed system. For instance, a plurality of stacked devices can include intercalated layers of an insulative material to electrically isolate devices from one another. Moreover, external layers can be included on a sensor. For instance, an upper graphene layer can be coated with a thin polymer layer, such as a biocompatible polymer such as PDMS, PET, or the like, which can protect the graphene layer, as well as avoid contact between the graphene layer and a structure on which the sensor is mounted, e.g., avoiding skin contact in a wearable sensor application.

Referring again to FIG. 1, the electrode layers 14, 15 on either side of a piezoelectric polymer layer 16 can be the same or can differ from one another and can be formed of any suitable material and according to any suitable formation techniques. In forming a sensor designed for use on a flexible surface, the electrodes can include a flexible material, though even if the material of the electrode layer is not particularly flexible, causing the electrode layers 14, 15 to crack during use, the materials can still be adequate as long as a good electrical contact is maintained under the expected conditions of use.

By way of example, electrodes 14, 15 can include one or more metal including, without limitation, silver, gold, copper platinum, iridium, aluminum, iron, chromium, nickel, copper, indium, tin, and titanium. In one embodiment, a flexible electrode can be utilized. For instance, electrode layers 14, 15 can include a nickel titanium alloy (NiTi), also known as Nitinol, which is a metal alloy of nickel and titanium, in which the two elements are present in roughly equal atomic percentages; for instance, from about 50 at. % to about 60 at. % Ni and from about 40 at. % to about 50 at. % Ti. In another embodiment, an electrode can include electronically active materials (e.g., metallic particles) held in a flexible binder to increase the flexibility of the electrodes.

To impart mechanical stability, the sensor can include a supporting substrate layer 18. The supporting substrate can be rigid or can be flexible, depending upon the particular desired application of a sensor. The supporting substrate layer 18 can optionally exhibit high flexibility, in those embodiments in which it is desired to form a highly flexible sensing device, and which can also increase the sensitivity of the sensor. Flexible polymers as may be attractive for use can exhibit a low Young's modulus. For instance, a supporting substrate layer 18 can incorporate a flexible polymer such that the supporting substrate layer 18 can exhibit a Young's modulus as determined according to ASTM E111-17 of about 5 MPa or less; for instance, from about 0.5 MPa to about 4 MPa in some embodiments.

Examples of polymers as may be utilized in forming a supporting substrate 18 can include, without limitation, poly(ethylene terephthalate) (PET), polydimethylsiloxane (PDMS), poly(ethylene naphthalate) (PEN), polycarbonate (PC), and polyurethane (PU), or any combination thereof. Such polymeric materials can be formed to exhibit a desired about of flexibility or can be rigid, as desired. Other polymers that typically serve as substrates for flexible and wearable electronics can optionally be utilized. Such polymers can be attractive for use as a supporting substrate due to characteristics such as low cost, biocompatibility, good mechanical strength, and chemical inertness.

In one embodiment, the supporting substrate layer 18 can be based upon a PDMS. PDMS can combine several advantages including relatively high operational temperature (up to 350° C.), high permeability to oxygen, ease of molding, compositional control, and low Young's modulus. Due to such beneficial characteristics, a flexible sensor exhibiting a very high sensitivity can be obtained for sensor devices that include a PDMS based supporting substrate.

In one embodiment, the supporting substrate layer 18 can be based upon PET. PET can likewise exhibit several advantages for a sensor, including good durability, biocompatibility, high chemical and moisture resistance, and excellent heat stability. In addition, PET can provide good adhesion with other materials, and thus, may adhere well to other metal and/or polymer components of a sensor. PET also can be formed to provide a highly flexible supporting layer and can exhibit optical transparency, which may be beneficial in some embodiments.

The thickness of the supporting substrate layer 18 can be an important parameter in the design of a sensor, as this value combined with the inherent flexibility of the layer 18 can be a significant determinant in the range of force/strain that can be applied to a sensor without damaging the physical structure, as well as in device attributes such as sensitivity. While a thinner supporting substrate layer 18 can encourage higher sensitivity as it experiences higher deformation for a given magnitude of external force/strain, a thin layer 18 can also limit the dynamic range of a sensor as the electrode layers 14, 15 can then be more susceptible to damage. In some embodiments, a supporting substrate layer 18 can have a thickness of about 5 mm or less—for instance, from about 100 µm to about 3 mm in some embodiments—though preferred thickness can vary depending upon the flexibility of the layer material and the expected conditions of use of the sensor, as would be evident to those in the art.

By way of example, the maximum applicable strain in a PDMS-based layer without introducing significant cracks in a metal layer deposited on top is reported to be about 0.8%, and it has previously been determined that a PDMS layer of about 175 µm will exhibit a maximum strain of about 0.8% for an applied pressure of about 50 mmHg on a square membrane with sides of 3 mm. Such characteristics can be considered when forming a sensor, but are well within the capabilities of one of skill in the art.

A piezoresistive sensor as described can avoid the significant limitations of previously known piezoelectric sensors in terms of steady state measurements and also high output impedance. Considering the overall aspects of sensitivity, measurement resolution, SNR, ease of fabrication (even in formation a large sensor), and response time, the performance capabilities of disclosed sensors make them very attractive for use in a wide variety of applications including wearable and implantable biomedical devices, as well as in smart monitoring systems to measure strain and pressure in real time. Beneficially, the sensors can be self-powered and can be used for dynamic sensing, as well as static sensing.

Disclosed sensors can provide a route for self-powered monitoring of physical activities such as walking, running, joint movement, etc. and can do so with a fast response in the millisecond region. The sensors can also be integrated into textiles, e.g., wearable fabrics, or other composite structures for a variety of wearable sensor applications.

Figure 3:
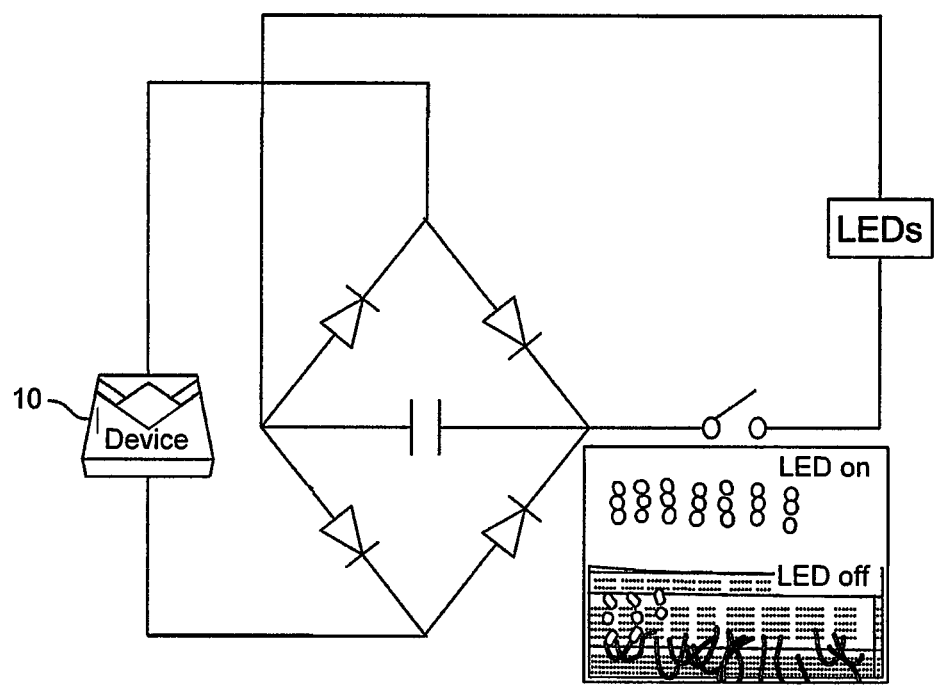
FIG. 3 illustrates an electric charging circuit as may be utilized for a sensor in an energy harvesting application.
Figure 4:
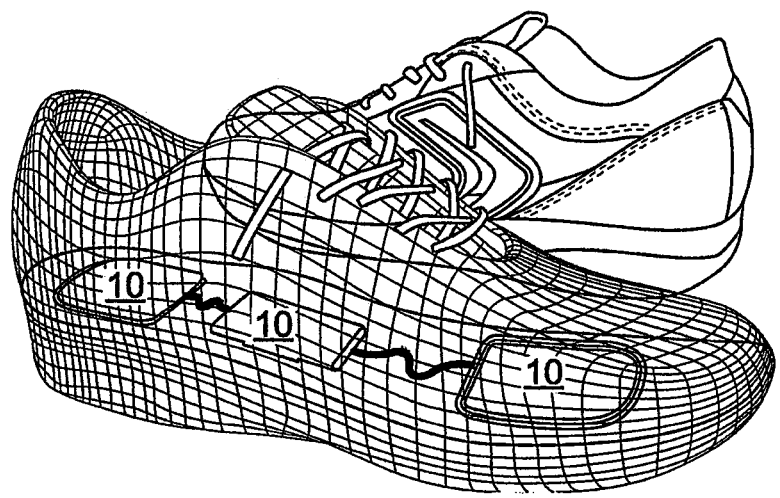
FIG. 4 illustrates one exemplary use for a sensor as described herein in conjunction with a shoe.

FIG. 3 presents a circuit diagram as may be used in an embodiment in which a sensor device 10 can be used in energy harvesting, such as in self-powering a device to provide a sensor readout via, e.g., an LED display, as illustrated. FIG. 4 illustrates another embodiment, in which a one or more sensors 10 can be located in a shoe and utilized in determining activity type (e.g., discrimination between walking, running, standing, sitting) and time (minutes walked per day, steps taken per day, etc.); for instance, for use in a fitness regime. Sensors can also be integrated with other materials, such as textiles or other wearable materials in wearable sensor applications to monitor, e.g., heart rate, blood pressure, motion type (walking, running, etc.).

Examples of implantable applications can include, without limitation, pressure/force measurements of the cardiovascular system (e.g., blood pressure and heart rate monitoring), self-powered cardiac pacemakers, bladder pressure (e.g., urinary bladder pressure), gastrointestinal applications (e.g., stomach pressure, digestive function), etc.

During use, a sensor can include a memory storage device that can be accessed at a time following use or, as discussed in more detail in the Examples section below, a sensor can communicate raw data in real time either wired or wirelessly to a processor that can include suitable software and calibration information to provide strain and pressure information in real time and/or stored for later access.

The present disclosure may be better understood with reference to the Examples set forth below.

Example 1

Fabrication of a sensor device was performed using separately optimized PDMS substrate, a P(VDF-TrFE) piezoelectric polymer, and graphene synthesized on copper foil. The sensor was fabricated following the sequential steps shown in FIG. 5.

To fabricate the PDMS substrate, liquid PDMS was prepared by mixing elastomer base with a cross-linker (SYLGARD™ 184 Silicon Elastomer Kit) in a weight ratio of 10:1, followed by degassing in a vacuum desiccator for 1 hour to remove bubbles. The liquid PDMS was spin-coated at 800 rpm for 20 seconds on a rectangular copper plate (2.5 cm (W)×2.5 cm (L)×0.0175 cm (H), FIG. 5 at (a)). After spin-coating, the layer was heated at 100° C. for 30 minutes in ambient conditions for the layer to fully set. The PDMS thickness could be varied by spin coating for different durations.

Figure 5:
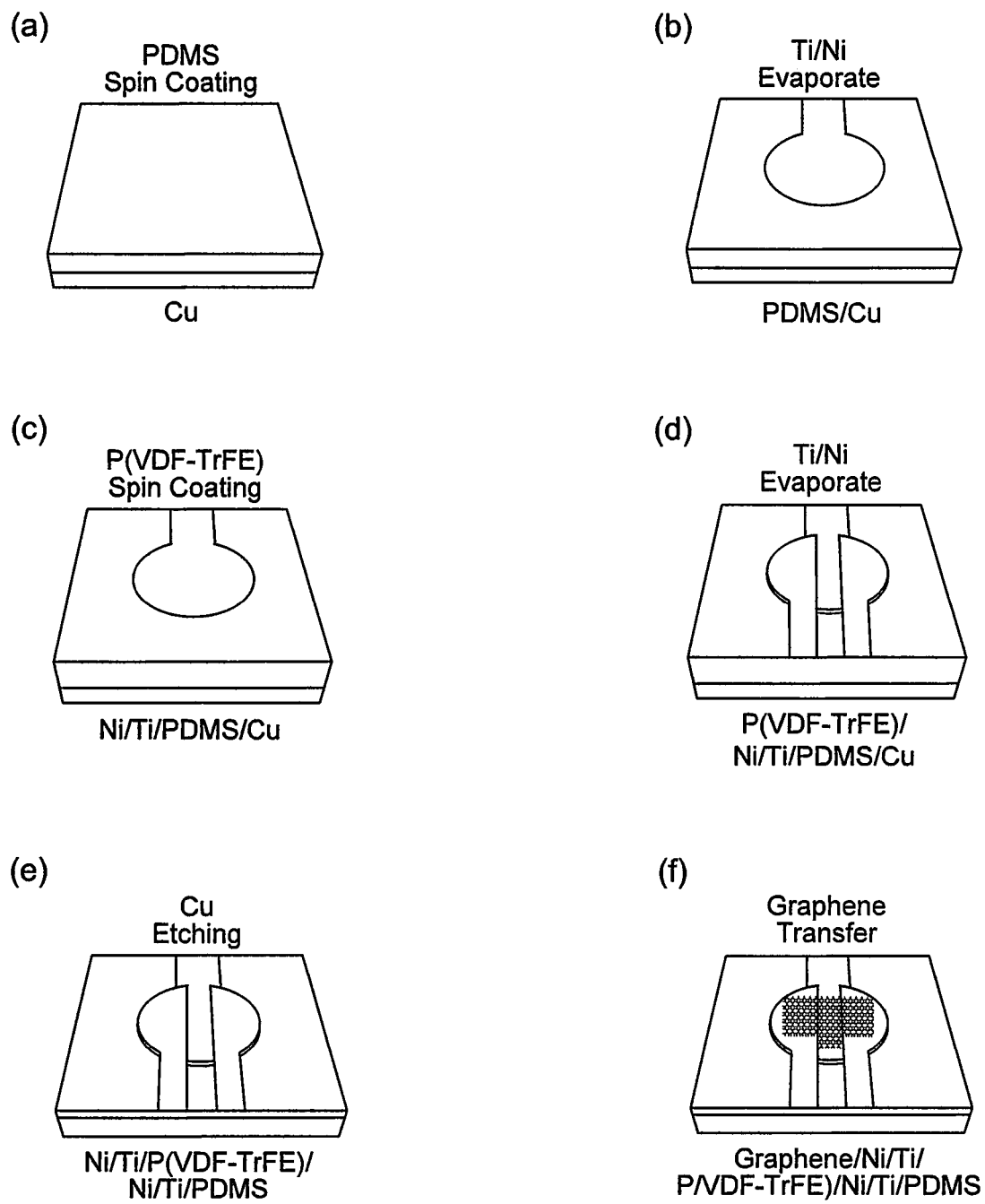
FIG. 5 presents a schematic diagram of a fabrication process as may be utilized in forming a sensor.

The bottom electrode for the sensor (radius=0.8 cm), Ti/Ni (30 nm/150 nm), was deposited on the PDMS/Cu at 100° C. by electron beam evaporation (FIG. 5 at (b)). Thermal treatment was carried out to improve the conductivity and homogeneity of the Ti/Ni metal stack deposited on the PDMS. The PDMS substrate was stretched while it was exposed to heat (with the Cu substrate underneath helping to spread the heat uniformly); this allowed the Ti (first metal, 30 nm) to penetrate into the PDMS substrate, and subsequent deposition of the Ni layer (second metal, 150 nm) led to the overall metal electrode contact becoming stable and reliable so as to tolerate the repeated bending and stretching from external strain.

A solution of P(VDF-TrFE) was prepared by dissolving copolymer powder of P(VDF-TrFE) (50/50, Piezoteche) in N,N-dimethylformamide (DMF) solvent and stirring for 12 hours at 40° C. to form a 13 wt. % of P(VDF-TrFE) solution. The prepared solution of P(VDF-TrFE) was then spin-coated on the Ni/Ti/PDMS/Cu at 6500 rpm for 60 seconds to obtain a thickness of 2 µm and was dried at 60° C. for 10 minutes to remove the DMF solvent. The thickness of the P(VDF-TrFE) film was controlled by varying the speed of rotation and measured using a profilometer across the edge to form a 2 µm thick film. The P(VDF-TrFE) film on the Ni/Ti/PDMS/Cu was subsequently heated in air at 140° C. for 2 hours to develop the β-phase of P(VDF-TrFE) (which is its most stable form with the highest piezoelectric constant), followed by natural cooling to room temperature (FIG. 5 at (c)). Another layer of Ti/Ni (30 nm/150 nm) was deposited to form the top metal electrode (in the form of two semicircular halves of 6 mm radius, with a gap of 2 mm in between) by e-beam evaporation as shown in FIG. 5 at (d). The Cu layer was then removed by dissolving in a solution of 0.5 M ammonium persulfate, as shown in FIG. 5 at (e). The device was floated in the solution which led to etching of the Cu layer.

Finally, the bottom of the device (the PDMS substrate) was rinsed multiple times in deionized (DI) water. Poling of the P(VDF-TrFE) was performed by subjecting the device to an electric field of 100 MV/m for 1 hour by applying a voltage of 200 V across the lower Ti/Ni metal layer and the two connected halves of the upper Ti/Ni metal layer. The $V_{gen}$ (measured at constant strain of 0.003) vs. $T_E$ (the time elapsed after poling) indicated that the degree of poling reduced with time (data not shown), but at a decreasing rate and becoming steady after a few days, at a value of about 55% of the maximum value achieved immediately after poling.

Monolayer graphene, synthesized through a chemical vapor deposition (CVD) process, was transferred onto the Ni/Ti/P(VDFTrFE)/Ni/Ti/PDMS layer structure using a wet transfer process (FIG. 5 at (f)). Briefly, graphene was grown on a copper foil (which acted as the substrate as well as the catalyst) at 1035° C. for 20 minutes using $CH_4$ as the precursor gas after the Cu foil was baked out in an Ar environment at 250° C. followed by a 2-hour anneal at 1000° C. The wet transfer process included coating two layers of PMMA on the graphene by spin-coating at 2000 rpm for 60 seconds, followed by oxygen plasma etch of the backside of the graphene grown on the Cu foil, and finally, Cu removal by etching in a solution of 0.5 M ammonium persulfate. The floated PMMA/graphene was rinsed multiple times in DI water, and then the PMMA/graphene was transferred onto the device as shown in FIG. 5 at (f). The device was then dried at 40° C. for 10 minutes in air. Finally, the coated PMMA was removed from the top of the transferred graphene using a few droplets of 1,2-dichloroethane (99%, Alfa Aesar™).

The structural and optical transmission properties of the P(VDF-TrFE) were investigated using Fourier transform infrared (FTIR) spectroscopy (Thermo Scientific™ Nicolet™ Model 380) and X-ray diffraction (XRD, Rigaku™ ULTIMA IV). Transferred graphene was characterized using Raman spectroscopy (CrystaLaser™ CL-2000) to verify its quality and monolayer structure. The carrier mobility and density in the graphene in the device layer structure were measured by a Hall effect measurement system (Ecopia™ HMS3000). The performance of the sensor was measured by attaching it to a printed circuit board specifically designed to hold the sensor, and utilizing a data acquisition unit (Agilent™ 34970A) controlled by a computer to record the data. A semiautomatic wire/ball bonder from Kulicke & Soffa® (KS 4524A) was used to make gold wire bonds between the circuit board pads and the Ti/Ni contacts of the sensor device.

Figure 8:
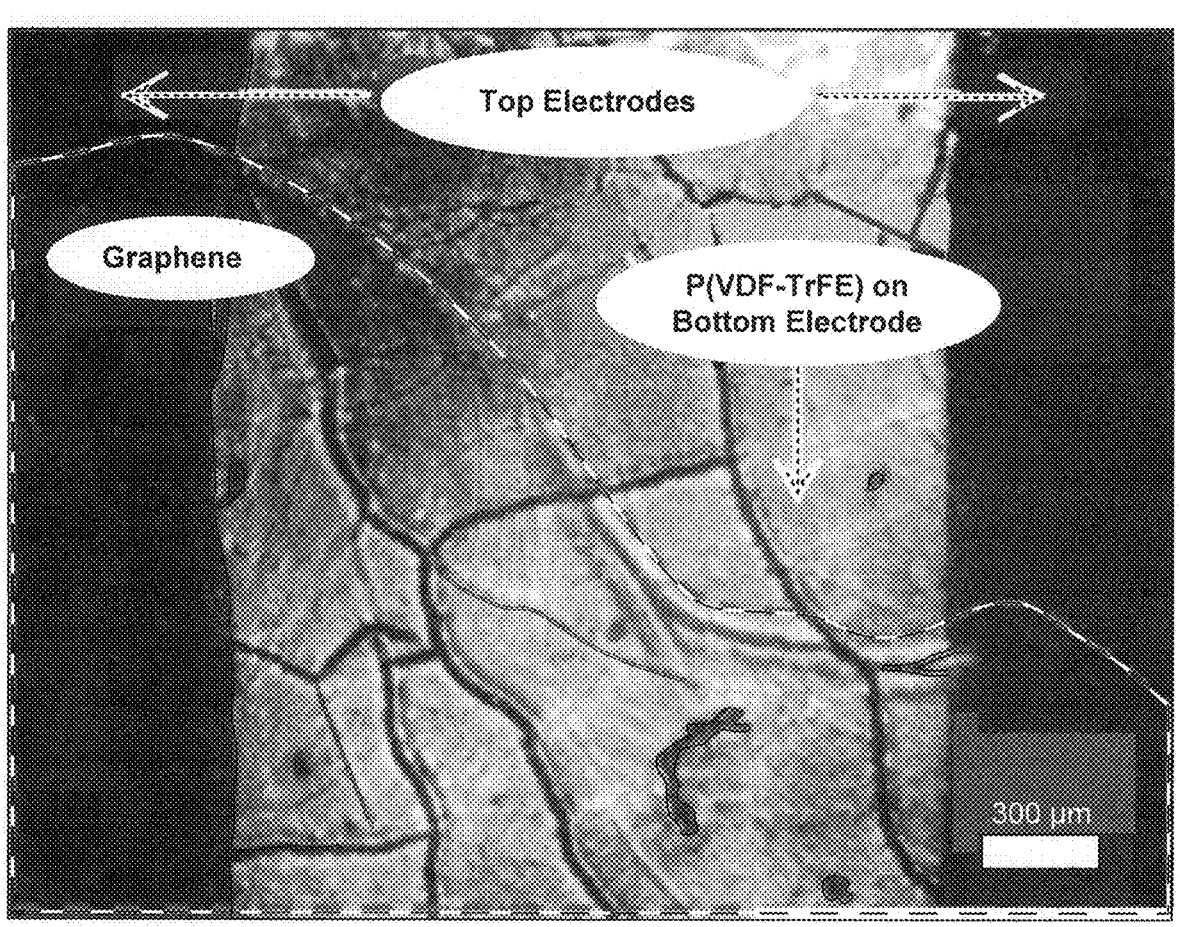
FIG. 8 is an optical microscopy image (1000×) of the active area of a sensor between top semicircular metal contacts.

FIG. 6 shows a schematic view of the strain/pressure sensor and its layer structure. The sensor included five layers: the PDMS substrate 18, the Ti/Ni top 14 and bottom 15 contact electrodes, the P(VDF-TrFE) film 16, and graphene 12. Because a comparable diameter of 16 mm was used, the thickness of PDMS substrate was chosen to be 175 μm to simultaneously achieve a high sensitivity, as well as good dynamic range. FIG. 7 shows photographs of the fabricated device laid flat (left) and folded across the diagonal (right) (which underlines its flexibility). A top view, optical microscope image of the sensor is shown in FIG. 8. The cracks seen at the center of the optical image in FIG. 8 were formed on the bottom electrode, which, despite the cracks, showed excellent electrical conductivity with linear current-voltage characteristics.

Figure 9:
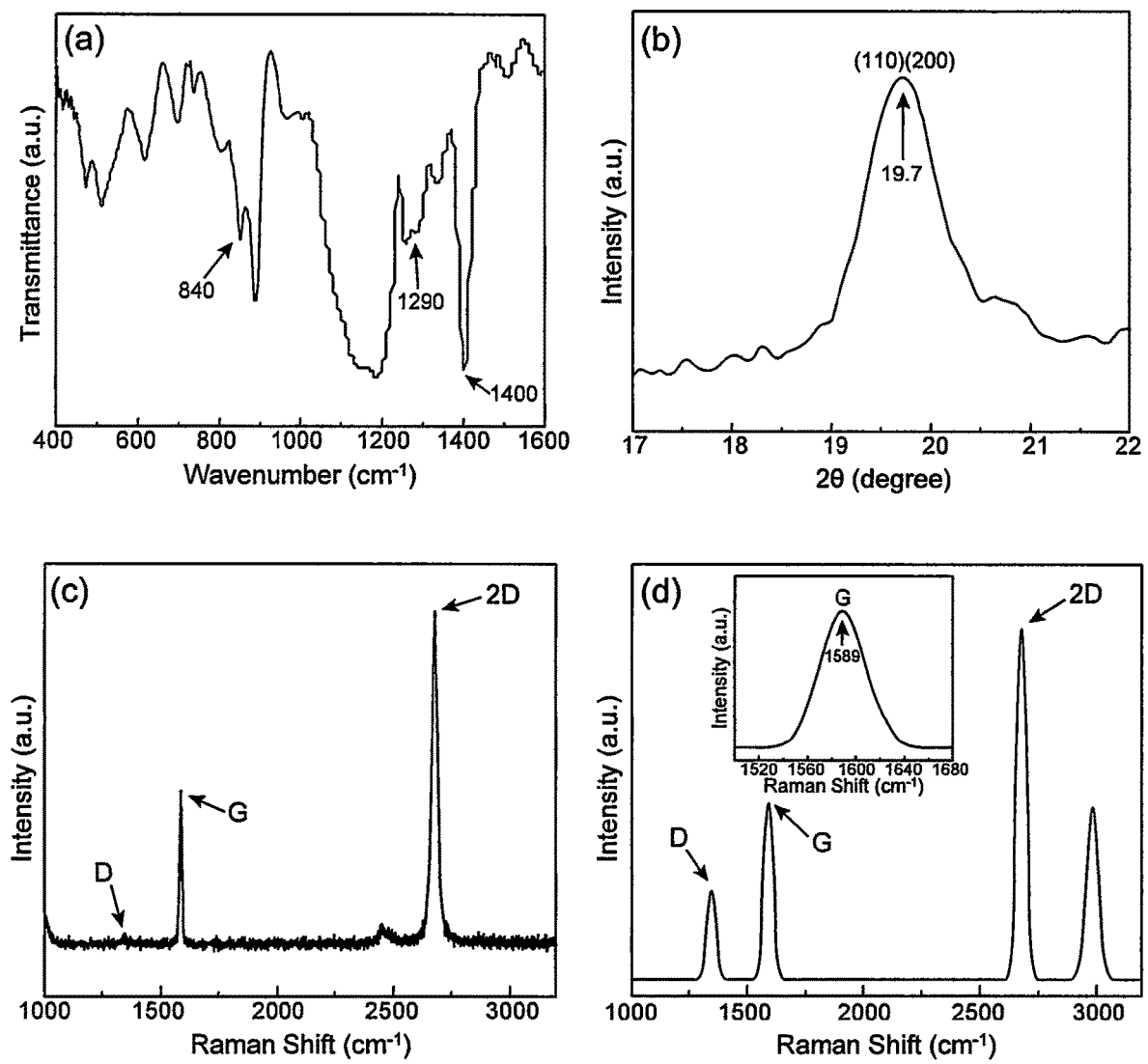
FIG. 9 includes (a) FTIR spectroscopy and (b) XRD scan of β-phase of a P(VDF-TrFE) film. At (c) is provided typical Raman spectra of graphene transferred to a $SiO_2$/Si substrate. At (d) is provided Raman spectra measured on graphene transferred to a P(VDF-TrFE) film.

The structure of the P(VDF-TrFE) film was confirmed using FTIR spectroscopy. FIG. 9 at (a) presents the FTIR spectrum of the P(VDF-TrFE) film at room temperature. The three absorption peaks at 840, 1290, and 1400 $cm^{-1}$ correspond to the $CF_2$ symmetric stretching and $CH_2$ wagging, respectively, for the β-phase of the P(VDF-TrFE) film, confirming its formation. In addition, the observation of diffraction peak at 2θ=19.7° (FIG. 9 at (b)), which is generally attributed to the orientation planes (110) and (200) for the polar β-phase of P(VDF-TrFE), once again confirmed its formation. The dip in transmittance at specific wavenumbers in FIG. 9 at (a) and the 2θ peak in (b) are pointed out by arrows in the figures.

FIG. 9 at (c) presents the Raman spectrum of a typical graphene layer transferred on $SiO_2$/Si substrate and at (d) presents the Raman spectra measured on the graphene transferred on P(VDF-TrFE) film. From the Raman spectra at FIG. 9 (c), the $I_D/I_G$ ratio was calculated as 0.13, which indicated very low defect density in the transferred graphene. In addition, the $I_{2D}/I_G$ ratio was calculated to be 2.1, which along with the full width at half maximum (2D peak) of 26.7 $cm^{-1}$, clearly indicated the presence of monolayer graphene and nominally defect free monolayer graphene. FIG. 9 at (d) shows the presence of significant defect peak (which was absent in the graphene film transferred to $SiO_2$/Si substrate). Defects can reduce mobility by increased charged impurity scattering.

To investigate the electrical properties, including sheet carrier density and mobility, on graphene transferred to $SiO_2$ (300 nm)/Si substrate (100, p+ doped), Hall measurements were performed by putting indium press contacts at the four corners. The results are shown in Table 1.

TABLE 1

| Graphene on | Mobility ($cm^2$/(Vs)) | Sheet carrier density ($cm^{-2}$) | Sheet resistance (Ω/sq) |
|---|---|---|---|
| $SiO_2$/Si | 3125 | $9.1 \times 10^{11}$ | $2.3 \times 10^3$ |
| Poled P(VDF-TrFE) before bending | 140 | $4.9 \times 10^{12}$ | $9.0 \times 10^3$ |
| Poled P(VDF-TrFE) after bending | 85 | $4.7 \times 10^{12}$ | $1.5 \times 10^4$ |
| Unpoled P(VDF-TrFE) | 35 | $1.5 \times 10^{23}$ | $1.2 \times 10^4$ |

The graphene on the $SiO_2$/Si was monolayer and that on P(VDF-TrFE) was 3 layers.

As shown in Table 1, the Hall mobility and carrier density were found to be 3125 $cm^2$/(V s) and $9.1 \times 10^{11}$ $cm^{-2}$, respectively, which are indicative of the high quality of the graphene layer. Scanning electron microscope (SEM) image of the P(VDFTrFE) film was also taken to determine its morphological quality (data not shown). In spite of a porous morphology, a vast majority of the area was still planar, and the deposited graphene could still make a reliable planar contact to it, offering a stable sensing behavior as observed from the sensor characteristics.

The data measurement set-up included a computer-controlled data acquisition system (Agilent™ 34970A), a nitrogen tank to apply gaseous pressure, the sensor connected to the gas line from the tank, and a gauge (Yash™ Flow Meters YG309) to measure the applied pressure. The sensor was attached to a custom-built printed circuit board (PCB) designed using EAGLE™ software. The PCB terminals were connected to the Ti/Ni metal contact pads on the sensor using gold wire bonds put in place using a semiautomatic wire/ball bonder. The output of the sensor, which simply constituted the resistance change of the graphene strip between the semicircular metal contact pads, was recorded for various pressures up to 45 mmHg in small steps of a few mmHg. The pressure applied to the sensor was manually adjusted using the pressure regulator on the nitrogen tank.

Figure 10:
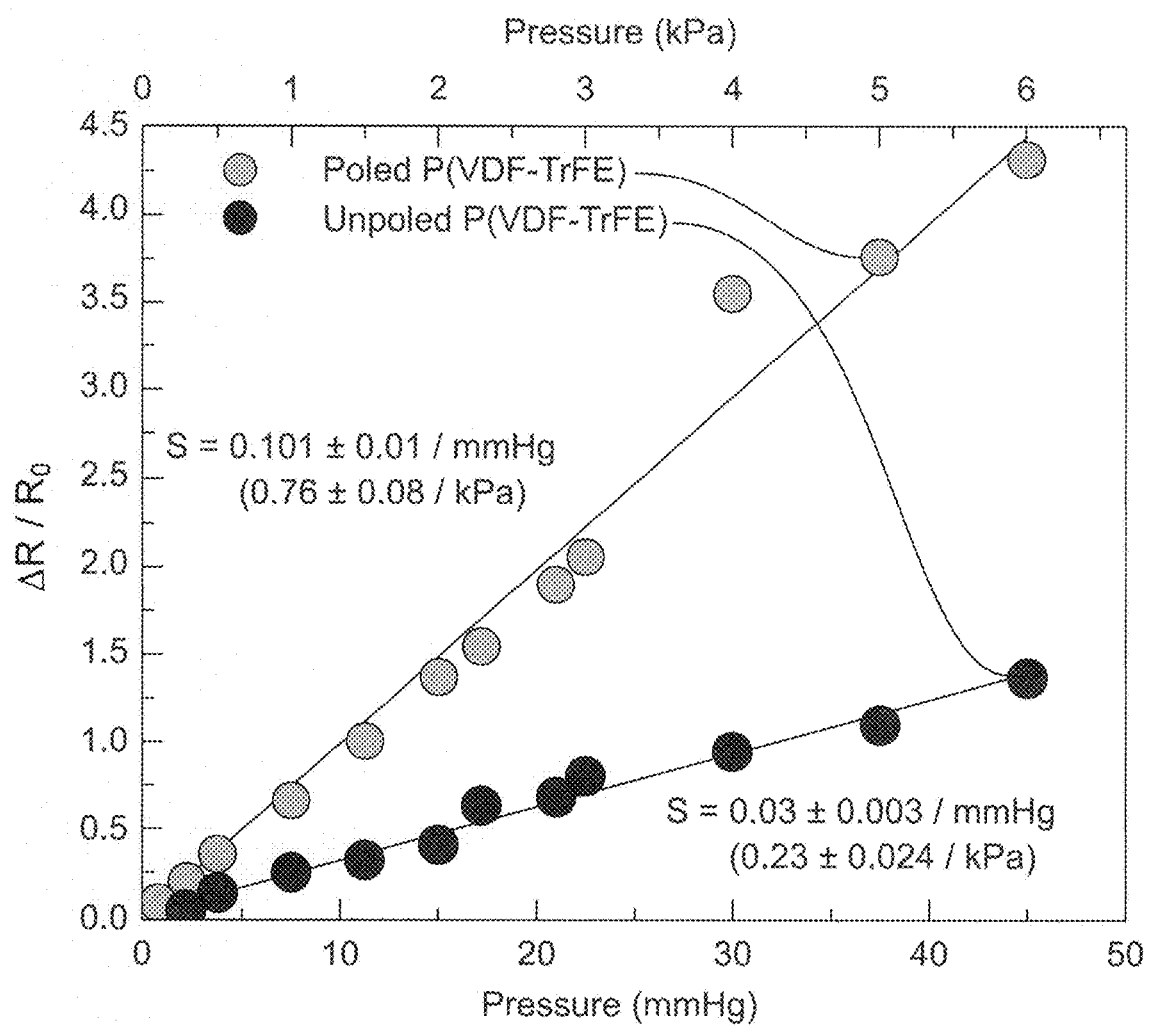
FIG. 10 illustrates fractional change in resistance of a sensor with applied pressure over the range of 0-45 mmHg. A least-squares fit line to the experimental data points is also shown.

The response of the graphene/P(VDF-TrFE) heterostructure-based sensor to varying external pressures over the range of 0-45 mmHg is shown in FIG. 10. As shown, the sensor response ($\Delta R/R_o$, where $\Delta R$ is the change in resistance and $R_o$ is the original resistance) increased monotonically and fairly linearly with increase in applied pressure. The sensitivity (S) of a sensor is generally defined as the slope of the output ($\Delta R/R_o$) to the input quantity (change in applied pressure $\Delta P$) and can be determined from the slope of the least-squares line fitted to the $\Delta R/R_o$ vs $\Delta P$ plot shown in FIG. 10. The sensitivity determined from FIG. 10 was 0.101±0.01/mmHg or 0.76±0.08/kPa (based on uncertainly of one standard deviation of the least squares fit line). To distinguish from mechanical deformation-related change in resistance, graphene transferred on an unpoled P(VDFTrFE) sample was also tested over the same pressure range, and the results are also included in FIG. 10 for comparison.

The change in resistance ($\Delta R/R_o$) of graphene on unpoled P(VDF-TrFE) was found to be significantly smaller (S=0.23/kPa) compared to that of the graphene on poled P(VDFTrFE), indicating that the polarization induced change in carrier density in graphene was strongly responsible for the high sensitivity displayed by the sensor. The response of the sensor utilizing unpoled P(VDF-TrFE) was likely occurring due to mechanical deformation of the geometry, which was aided by potential cracking of the graphene layer. As used herein, mechanical deformation refers to change in active area geometry of the sensor under strain (with more change happening in the higher strained areas), with consequent increase in the overall resistance.

From the fractional change in resistance ($\Delta R/Ro$) for a specific applied pressure, the gauge factor (GF) of the sensor can be calculated using the formula GF=($\Delta R/Ro$)/$\varepsilon$, if the strain $\varepsilon$ at that pressure is also known. GF is an important parameter for a strain/pressure sensor, enabling direct comparison of its performance to other strain sensors regardless of their different dimensions or technology basis. A widely used method for determining strain relies on finite element simulations using software packages such as ABAOUS™ CAE™ and COMSOL™. Of course, if the geometry of the sensor is symmetric, as was the case here, the strain can be determined directly from analytical formulations by plugging in the deflection values to independently verify the simulation results.

Figure 11:
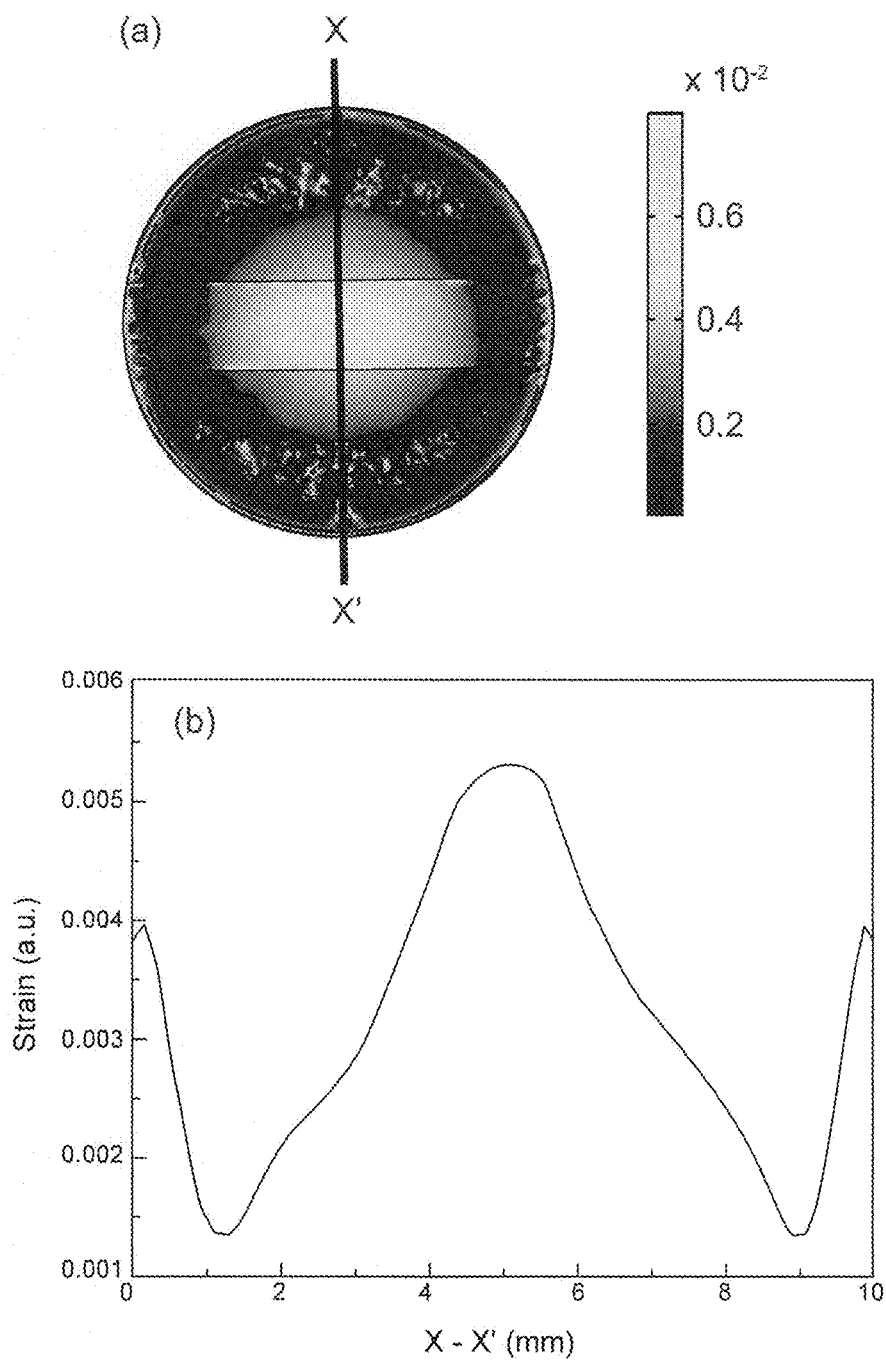
FIG. 11 illustrates at (a) strain distribution over an entire circular membrane as determined from a COMSOL based finite element simulation. At (b) is shown the strain variation along the XX' line (direction of current flow) shown in (a) to provide a numerical reference.

The stress and strain distributions across the sensor membrane (radius=8 mm) were simulated using COMSOL Multiphysics. The sensor was attached with a super glue to the PCB with a hole in the center (radius=8 mm) to apply various pressures to the sensor membrane. For simulations, the outer edge of the circular membrane was assumed to be fixed, and a uniform pressure of 15 mmHg (2 kPa) was assumed to be applied at the bottom surface of the membrane. FIG. 11 at (a) shows the strain distribution for the P(VDF-TrFE) layer of the sensor. From the strain distribution in the active region of the sensor (rectangular graphene-covered region between the two metal contacts marked in FIG. 11 at (a)), the peak and average strains were computed to be 0.0052 and 0.00326, respectively. FIG. 11 at (b) shows the variation of strain along the line XX', which is in the direction of the current flow in the active region of the device. The active region was clearly visible due to color contrast arising from higher strain because of lack of metal coating, unlike the other areas of the suspended circular membrane.

Figure 12:
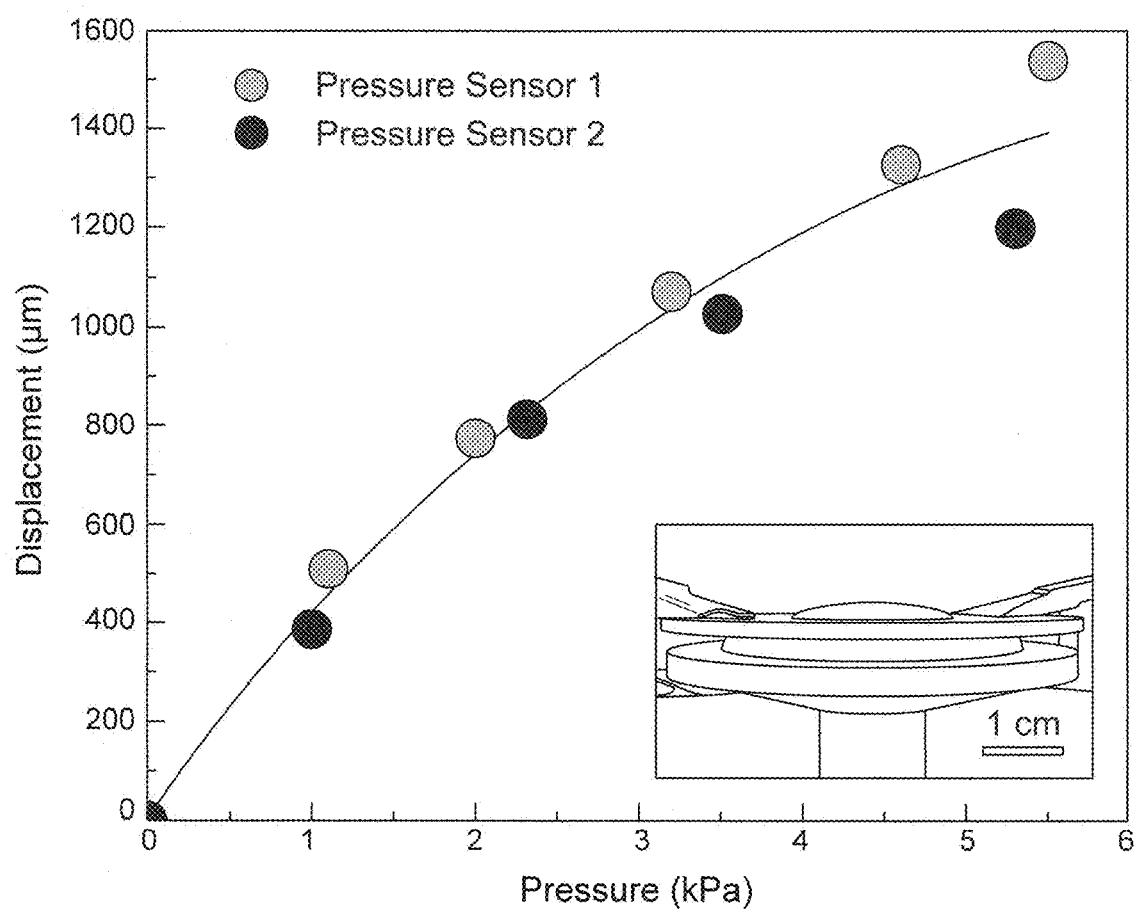
FIG. 12 illustrates variation of membrane deflection at the center (maximum displacement) of a sensor under various applied pressures for two different sensors with same nominal dimensions. The least-squares fit line is also shown.

The maximum strain obtained from simulations was compared to that determined from analytical formulation correlating the maximum deflection in a circular membrane w0 with radial strain $\varepsilon R$ as;

$$\varepsilon\_R \approx 2/3 (w\_0^2)/(R\_m^2) \tag{1}$$

where Rm is the radius of the membrane. To determine $\varepsilon R$ from Eq. 1, the deflection of the membrane was measured under various applied pressures for two different sensor devices, with same nominal membrane diameter and thickness of 16 mm and 175 µm, placing them sideways under an optical microscope (Micromanipulator Corp.™; Model No, 6000). The combined plot showing membrane deflections of both the devices with applied pressure (in the range 0-5.5 kPa) is shown in FIG. 12. A nonlinear least-squares fit to the data points (which showed a mild saturating trend) is shown and indicated that the deflection at a pressure of 2 kPa (15 mmHg) was about 750 µm or 0.75 mm. From Eq. 1, the strain was calculated as about 0.0059, which is in close agreement with the maximum strain determined from COMSOL™ simulations of about 0.0052. Because the analytical formulation is an approximation and is strictly valid only for a simplified membrane structure (without any metal or other layers), the strain obtained through simulations was used to calculate the GF for the sensor. Nonetheless, the closeness of the strain values determined from two completely unrelated methods was remarkable and highlights the robustness of the estimation process. Considering the fractional change in resistance $\Delta R/Ro$=1.45 corresponding to an applied pressure of 15 mmHg (obtained from the least-squares fit line in FIG. 10) and the average value of strain determined from simulations of 0.00326, the GF was calculated to be 445.

Figure 13:
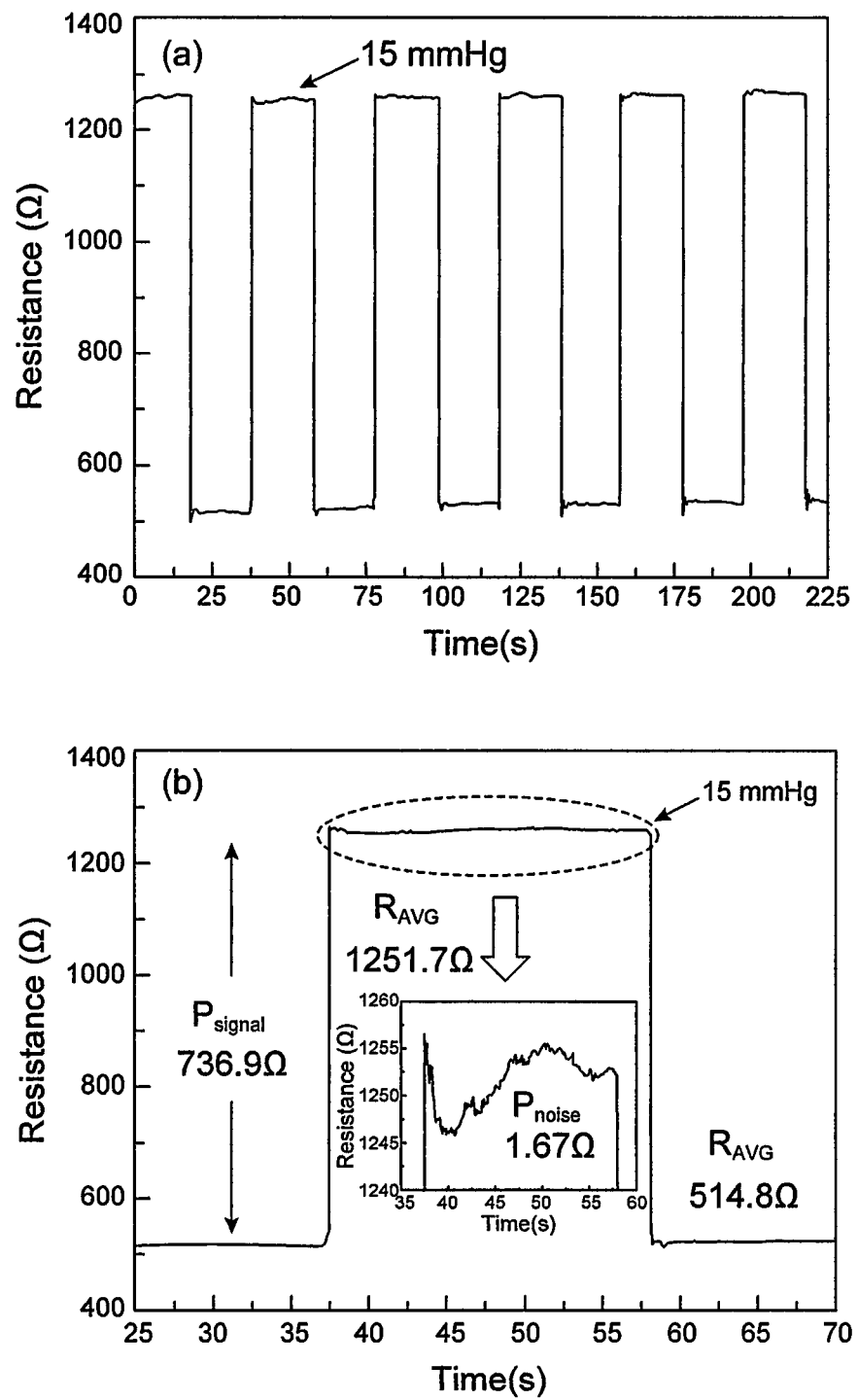
FIG. 13 shows at (a) the variation in sensor resistance with time as the pressure on a membrane was switched ON and OFF, between 0 and 15 mmHg pressure, over six cycles. At (b) is shown a magnified single pulse, between 25 and 70 s from the image of (a) to estimate the response and relaxation times. The inset shows a plot between 35 and 60 s with magnified y-axis to determine noise in the response signal and to calculate signal—to noise ratio.

FIG. 13 at (a) shows the response of the sensor as it was subjected to multiple cycles of external pressures, between 0 and 15 mmHg, alternatively for 20 s duration, over six cycles. The resistance changed from about 500 to about 1250Ω consistently over the cycles of measurement, yielding a fractional resistance change $\Delta R/R_o$ of about 1.5 (which is very close to the observed value of fractional resistance change of 1.45 in FIG. 10). FIG. 13 at (b) shows a magnified single response pulse, which constitutes the response between 25 and 70 s in FIG. 13 at (a). From the pulse, the signal-to-noise ratio (SNR) was determined, which ultimately determines the measurement resolution. A common limitation of pressure sensors is low SNR, which essentially prevents them from measuring small pressure changes. The SNR is expressed in dB can be calculated using the equation $$SNR_{dB} = 20 \log((\Delta R/R_{signal})/(\Delta R/R_{noise})) \tag{2}$$

where $\Delta R/R_{signal}$ is the fractional change in resistance due to an applied pressure was 15 mmHg and $\Delta R/R_{noise}$ is the standard deviation of the resistance fluctuation at that pressure. From FIG. 13 the $\Delta R/R_{signal}$ was determined to be 736.9/514.8=1.4314, and the $\Delta R/R_{noise}$ was determined to be 1.673/1251.7=0.0013, which resulted in an SNR value of 1.4314/0.0013=1101 or 60.8 dB from Eq. 2. The minimum detectable pressure was determined from the direct signal-to-noise ratio and the sensitivity. From the average sensitivity of 0.76/kPa as determined from FIG. 10, the minimum detectable pressure was determined to be ($\Delta R/R_{noise}$)/sensitivity=0.0013/(0.76/kPa) or 1.7 Pa. The rise times and fall times were estimated from the magnified time axis plot of pulse shape in FIG. 13 at (b) to be <100 ms as the low-to-high and high-to-low responses change within a time less than the time gap of 100 ms between two consecutive data points, which is the data acquisition recording rate. The overall time constant is a combination of the switching time constant and the sensor time constant and likely to be <<100 ms.

Figure 14:
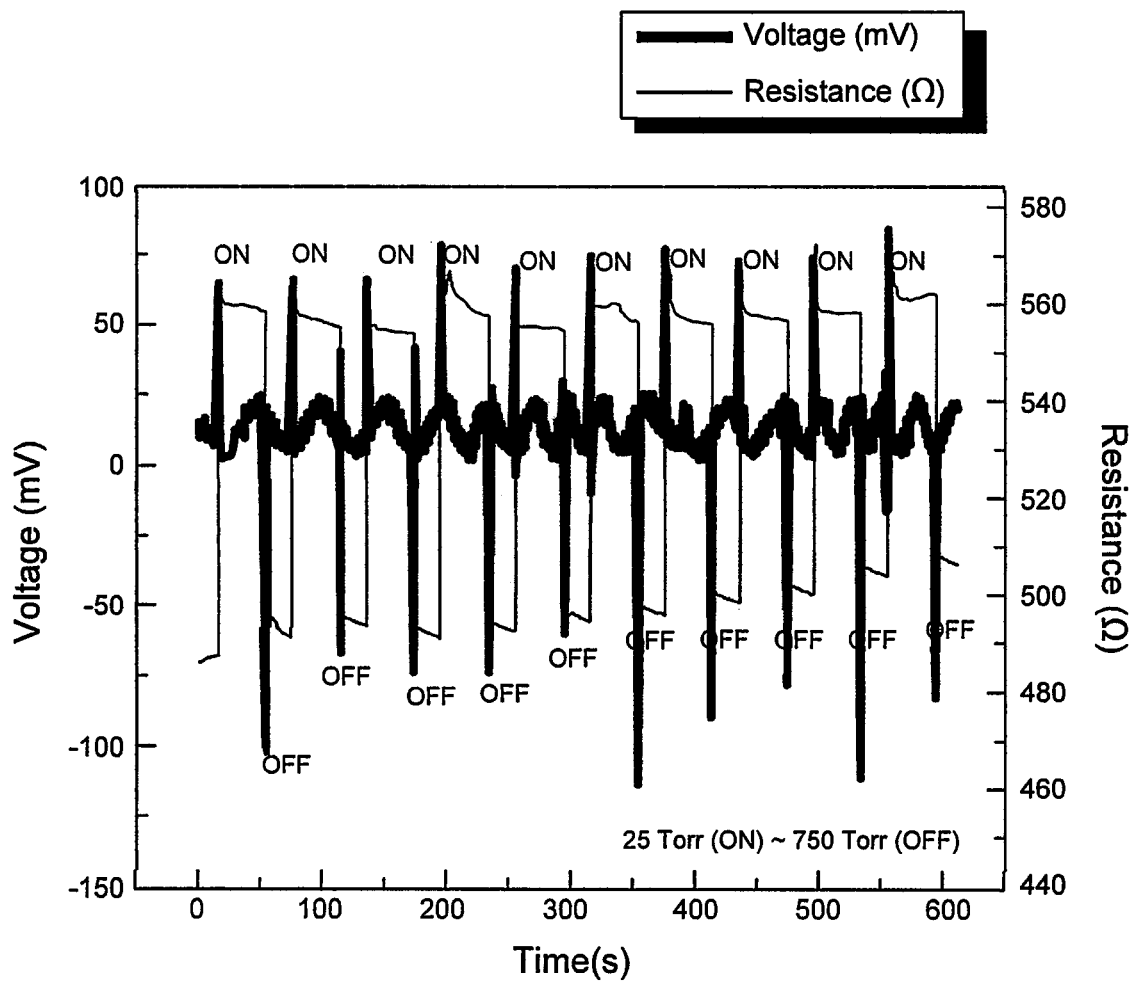
FIG. 14 illustrates simultaneously measured resistance change and piezovoltage generated between the top and the bottom electrodes of a sensor at a strain of 0.003.

To verify the association between fixed charge generation on P(VDF-TrFE) surface and resistance, the resistance change and piezovoltage generated between the top and the bottom electrodes were measured simultaneously, and the results are shown in FIG. 14. The voltage spikes were observed to coincide with the step changes in resistance (as the pressure was switched ON and OFF, causing the strain change), clearly indicating surface charge generation in the P(VDF-TrFE) film and its association with graphene resistance changed, supporting the proposed model discussed previously. The measured voltage pulses on FIG. 14 coincided with the beginnings of resistance change, when the film was strained and when it was relaxed, but in opposite directions, as expected. The sinusoidal noise came when both resistance change and voltages are measured simultaneously using two data acquisition channels.

Figure 15:
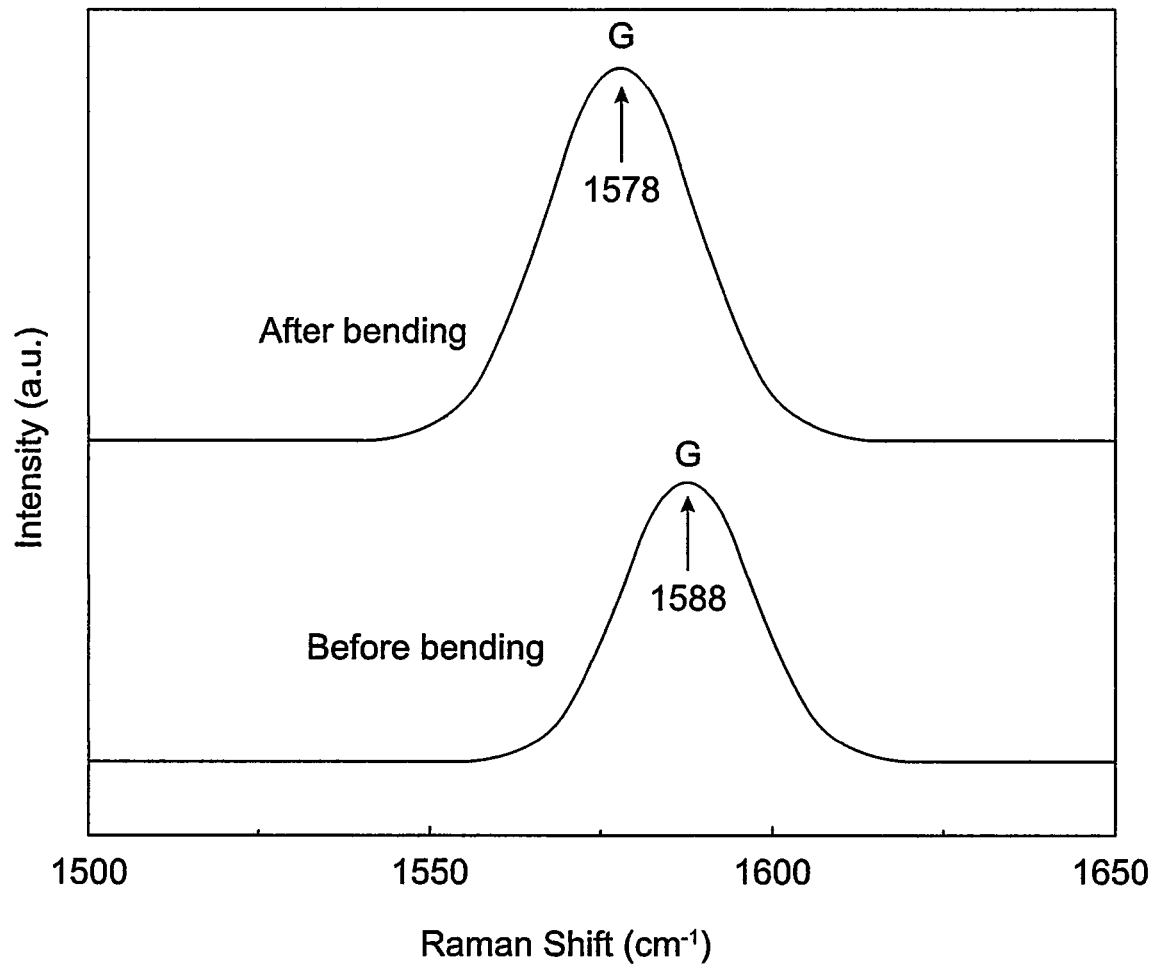
FIG. 15 illustrates Raman spectra showing shift in the graphene G peak position before and after bending on a sensor that included poled P(VDF-TrFE).
Figure 16:
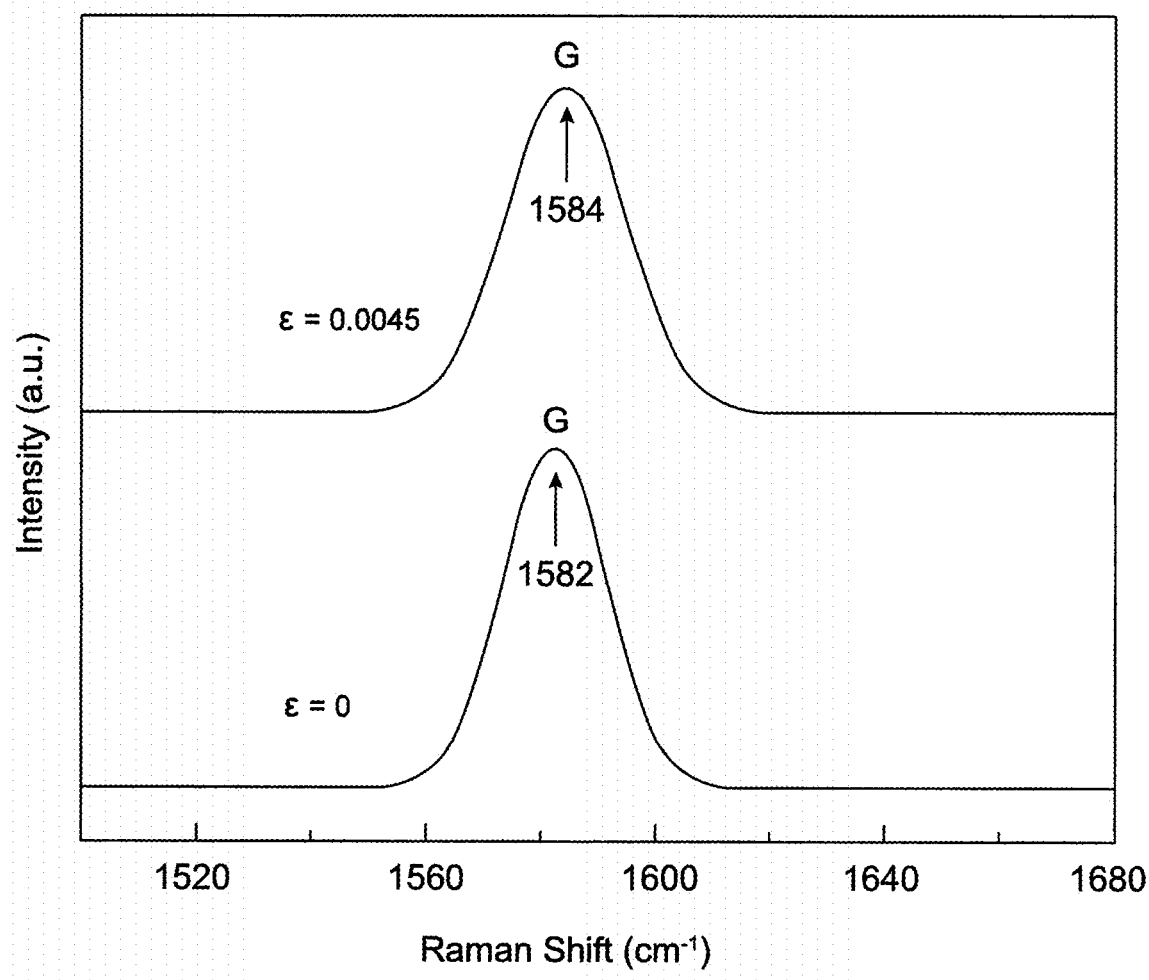
FIG. 16 illustrates Raman spectra showing shift in the graphene G peak position before and after bending on a sensor that included unpoled P(VDF-TrFE).

To further investigate the carrier density variation in graphene induced by strain in P(VDF-TrFE), Raman spectroscopy was performed on the device, in strained and unstrained conditions. In addition, Raman measurements were performed on unpoled P(VDF-TrFE), where only strain is expected to affect G-peak position. FIG. 15 shows the shift in the G-peak from 1589 and 1581 $cm^{-1}$ under a strain of 0.45% for poled P(VDFTrFE), whereas the G-peak did not change significantly (actually, blue shifts by 2 $cm^{-1}$ from 1582 to 1584 $cm^{-1}$, the cause of which is unknown, but it is within the measurement error bar of ±2 $cm^{-1}$) for the graphene on unpoled P(VDF-TrFE) (FIG. 16). A red-shift in the G-peak in FIG. 15 confirmed the upward movement of the Fermi level (toward the Dirac point, since graphene is p-type) for graphene under strain, which supports the results from the electrical measurements. Even though strong red-shift in G-peak is also expected for graphene under strain on unpoled P(VDF-TrFE), no significant shift was observed experimentally (FIG. 16). This was attributed to possible localized cracking in the graphene film which caused the strain in the graphene layer to be negligible. Thus, the shift in G-peak in poled P(VDF-TrFE) can be considered to be primarily due to change in charge density. The shift in wavenumber by 8 $cm^{-1}$ translates into a charge density change of a few×$10^{12}$ $cm^{-2}$, considering a movement of about 2 $cm^{-1}$ for every $10^{12}$ $cm^{-2}$ units of charge density change. Although direct measurement of carrier density was not possible in the actual sensor device due to its specific device geometry, Hall measurements were performed on graphene transferred to a commercial large area polarized P(VDF-TrFE) sample under strained and unstrained conditions. Table 1, above, shows the carrier density, mobility, and sheet resistance in graphene to be 4.9×$10^{12}$ $cm^{-2}$, 140 $cm^2/(V\,s)$, and 9 kΩ/sq under unstrained conditions. From the resistance of the sensor device of about 500 Ω and the dimensions (L×W) of 2×14 $mm^2$, the sheet resistance can be calculated as 3.5 kΩ/sq, which is within a factor of 3 of the sheet resistance of graphene transferred on poled commercial P(VDF-TrFE). Therefore, the charge density and mobility in the sensor is expected to be within a factor of 2-3 (higher) of the values obtained on the commercial P(VDF-TrFE) sample.

The mobility of 140 $cm^2/(V\,s)$ measured on the sample was much lower than that measured on $SiO_2$/Si substrate, indicating the strong influence of the P(VDF-TrFE) substrate on carrier mobility, possibly through defect generation and charged impurity scattering. Indeed, Raman spectra measured on the graphene transferred on P(VDF-TrFE) showed a significant defect peak (FIG. 9 at (d)) that was absent in the graphene transferred to $SiO_2$/Si substrate (FIG. 9 at (c)). Under an applied peak strain of 0.0092 (calculated using a displacement of 1 mm and a membrane radius of 8.5 mm in eq. 1), the carrier density, mobility, and sheet resistance of the graphene changed to 4.7×$10^{12}$ $cm^{-2}$, 85 $cm^2/(V\,s)$, and 15 kΩ/sq. The sheet resistance increased by a factor of 55.5%, which is smaller by a factor of about 3 compared to the change in resistance (155%) observed for the device at almost half the strain of 0.0052 at 2 kPa pressure (FIG. 10). The difference can be attributed to the variation in piezoelectric properties of the P(VDF-TrFE) purchased commercially and the prepared material (the commercial sample showed significantly lower output voltage under similar strain). The mobility reduced very significantly, which can likely be attributed to enhancement in charged impurity scattering. The carrier density also decreased, as expected from surface doping induced by the positive fixed charge on the P(VDF-TrFE) surface. While the change in electronic properties for the sensor device could not be measured, the above measurements still serve as a useful guide for the changes that are actually happening to the actual device under strain (i.e., reduced carrier density, mobility, and conductivity). Overall, the results obtained from electrical, Raman, and Hall measurements support the model explaining the sensor device operation and its ultra-high sensitivity. The errors in the values are within a few percentages, which is mostly from the measurement instrument.

Example 2

Figure 17:
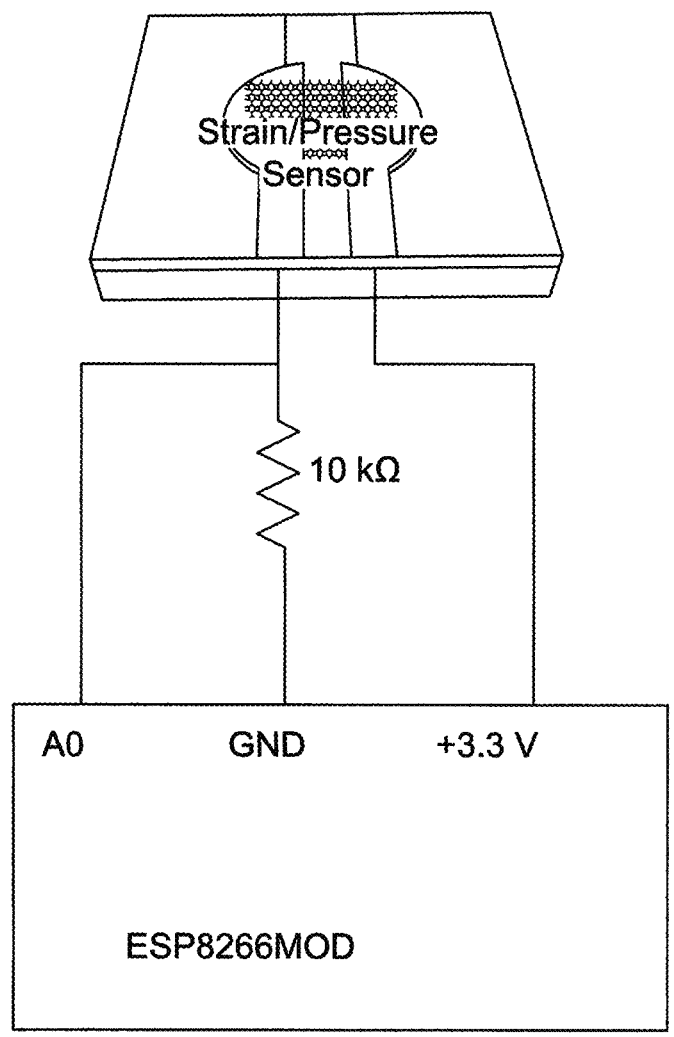
FIG. 17 illustrates an electronic circuit used for connecting sensor terminals to a Wi-Fi module.

A practical application of a sensor, as described in Example 1, was demonstrated by using it to monitor the motions of a human hand. To monitor human movement using the sensor, a circuit board from Adafruit™ (ESP8266MOD) was used to collect the data and transmit through Wi-Fi in real time while the movement was performed. The electronic circuit is schematically illustrated in FIG. 17. The data were transmitted from the sensor every 5 seconds using the ESP8266 Wi-Fi module which used the message queuing telemetry transport (MQTT) protocol for transmitting the data. The response of the sensor was read in terms of variation of voltage across a 10 kO resistor connected in series with the sensor. The sensor resistance varied with application of an external strain or pressure, which altered the voltage across the 10 kΩ resistor that was read on the analogue pin of the ESP8266 chip, and subsequently transmitted to the cloud. The analogue voltage across the 10 kΩ resistor was mapped by a 10-bit analog-to-digital converter (ADC) in the ESP8266 Wi-Fi module. These ADC values were then sent to the cloud and retrieved in a computer for plotting.

Figure 18:
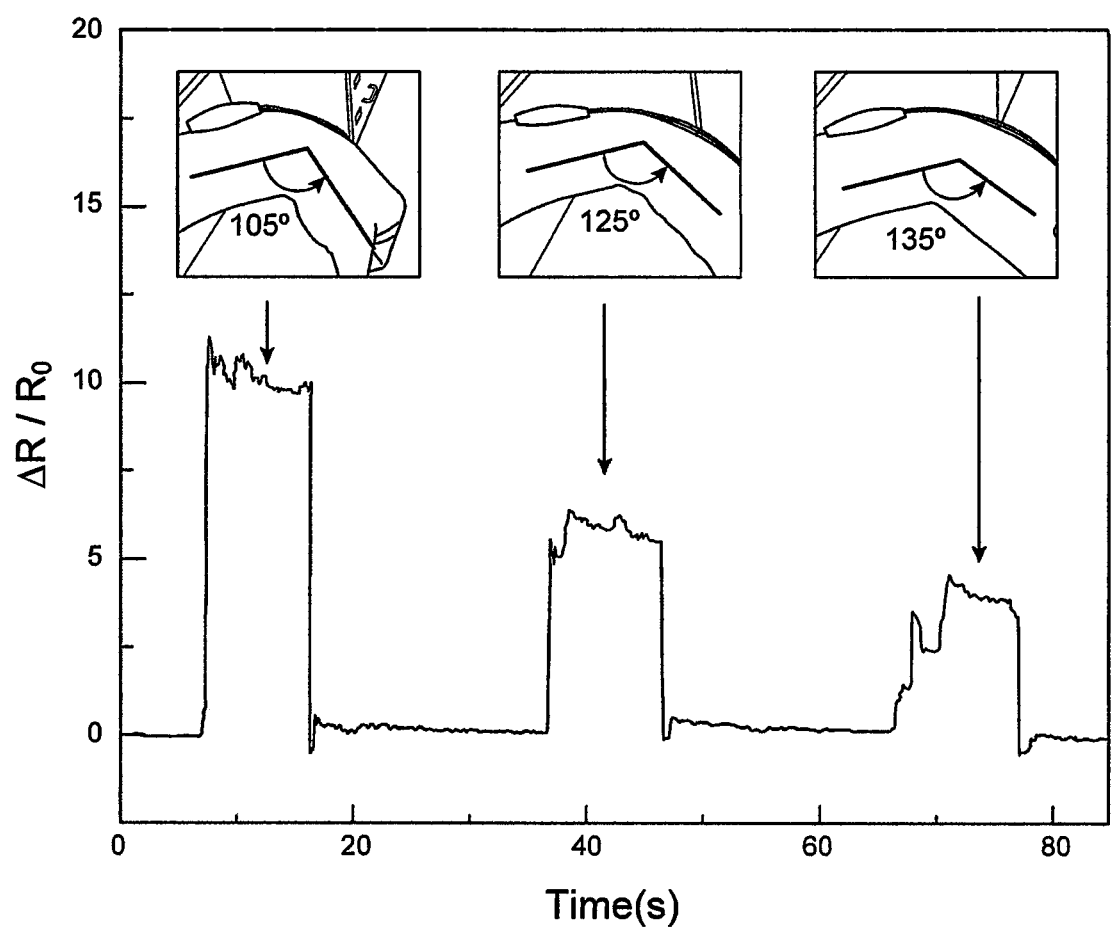
FIG. 18 demonstrates a practical application of a sensor by recording human hand movement.

The sensor was physically attached to the wrist, and it was bent at three different angles (resembling typical hand movement) of 105°, 125°, and 135° to result in variable strain in the sensor. The thickness of PDMS for the sensor was increased to 1.5 mm for this test to prevent crack formation in the bottom electrode on the PDMS substrate under high strain due to bending, which would expectedly reduce sensitivity and SNR. FIG. 18 shows the pictures of the wrist (with the attached sensor) corresponding to the three bend angles, and the corresponding sensor responses, as the wrist was bent and straightened back.

Figure 19:
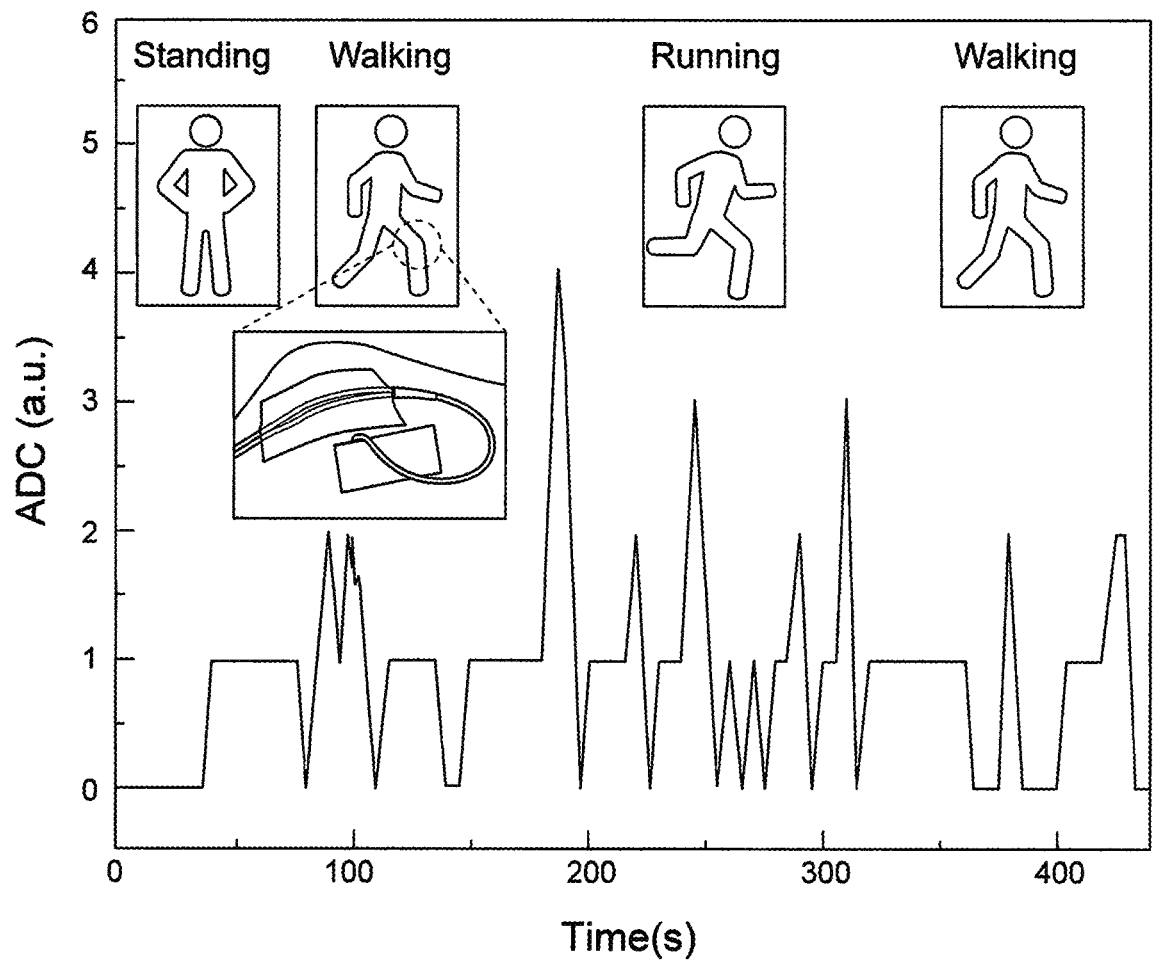
FIG. 19 demonstrates another practical application a sensor placed on a wearer's knee and recording human walking, standing, and running.

The fractional resistance (ΔR/R) changed monotonically from about 3.5 for 135° bent (gentler) to about 10 for 105° bent (sharper). The efficacy of the sensor was also used to distinguish between different activities like standing, walking, and running (FIG. 19) based on the different degrees of knee movement that occurs during those activities. For both the knee and wrist movements, the sensor signal was recorded using the Wi-Fi enabled module connected to the sensor.

While certain embodiments of the disclosed subject matter have been described using specific terms, such description is for illustrative purposes only, and it is to be understood that changes and variations may be made without departing from the spirit or scope of the subject matter.

What is claimed is:

1. A piezoresistive strain sensor comprising:
a first layer including a poled piezoelectric polymer;
a second layer comprising graphene;
a first electrode between the first layer and the second layer;
a second electrode, the first layer separating the first electrode and the second electrode; wherein
the first and second layers are in electrical communication with one another such that the piezoelectric polymer and the graphene form a heterojunction.

2. The piezoresistive strain sensor of claim 1, wherein the first electrode is a flexible electrode.

3. The piezoresistive strain sensor of claim 2, wherein the second electrode is a flexible electrode.

4. The piezoresistive strain sensor of claim 1, the piezoelectric polymer comprising a polyvinylidene difluoride polymer or copolymer.

5. The piezoresistive strain sensor of claim 4, the piezoelectric polymer comprising polyvinylidene difluoride-co-trifluoroethylene.

6. The piezoresistive strain sensor of claim 1, the second layer comprising from 1 to about 10 individual graphene sheets.

7. The piezoresistive strain sensor of claim 1, wherein the graphene comprises p-type graphene or n-type graphene.

8. The piezoresistive strain sensor of claim 1, the piezoresistive strain sensor further comprising a supporting substrate layer.

9. The piezoresistive strain sensor of claim 8, the supporting substrate layer comprising a polymer exhibiting a Young's modulus of about 5 MPa or less.

10. The piezoresistive strain sensor of claim 8, the polymer comprising poly(ethylene terephthalate), polydimethylsiloxane, poly(ethylene naphthalate), polycarbonate, polyurethane, or any combination thereof.

11. The piezoresistive strain sensor of claim 1, wherein the sensor is biocompatible.

12. The piezoresistive strain sensor of claim 11, wherein the sensor is implantable.

13. The piezoresistive strain sensor of claim 11, wherein the sensor is wearable or wherein the sensor is integrated with a textile.

14. The piezoresistive strain sensor of claim 1, wherein the sensor exhibits one or more of:
an average sensitivity of about 0.5 kPa$^{-1}$ or higher,
a signal to noise ratio of about 20 decibels or higher,
a gauge factor of about 5 or more.

15. The piezoresistive strain sensor of claim 1, wherein the sensor exhibits a step response.

16. A method for forming a piezoresistive sensor comprising
locating a first layer adjacent to a second layer, the first layer comprising a piezoelectric polymer and the second layer comprising graphene, the first and second layers being located such that the piezoelectric polymer and the graphene are in electrical communication with one another and form a heterojunction;
locating a first electrode between the first layer and the second layer;
locating a second electrode adjacent the first layer such that the first layer separates the first electrode and the second electrode; and
poling the piezoelectric polymer.

17. The method of claim 16, further comprising locating a supporting substrate layer adjacent to the first layer or the second layer.

18. The method of claim 16, wherein the piezoelectric polymer is poled by subjecting the first layer to an electric field of from about 50 MV/m to about 150 MV/m.

19. The method of claim 16, the method further comprising:
forming the second layer by forming graphene on a copper foil; and
transferring the graphene to a surface of the first layer or a surface of the first electrode.

* * * * *